United States Patent
Ogiwara et al.

(10) Patent No.: US 10,125,310 B2
(45) Date of Patent: Nov. 13, 2018

(54) ORGANIC ELECTROLUMINESCENCE ELEMENT AND ELECTRONIC DEVICE

(71) Applicant: IDEMITSU KOSAN CO., LTD., Chiyoda-ku (JP)

(72) Inventors: Toshinari Ogiwara, Sodegaura (JP); Yuichiro Kawamura, Sodegaura (JP)

(73) Assignee: IDEMITSU KOSAN CO., LTD., Chiyoda-ku (JP)

( * ) Notice: Subject to any disclaimer, the term of this patent is extended or adjusted under 35 U.S.C. 154(b) by 0 days.

(21) Appl. No.: 15/546,215

(22) PCT Filed: Feb. 2, 2016

(86) PCT No.: PCT/JP2016/053109
§ 371 (c)(1),
(2) Date: Jul. 25, 2017

(87) PCT Pub. No.: WO2016/125807
PCT Pub. Date: Aug. 11, 2016

(65) Prior Publication Data
US 2018/0051204 A1 Feb. 22, 2018

(30) Foreign Application Priority Data
Feb. 6, 2015 (JP) ................. 2015-022731

(51) Int. Cl.
*H01L 51/50* (2006.01)
*C09K 11/06* (2006.01)
(Continued)

(52) U.S. Cl.
CPC ............ *C09K 11/06* (2013.01); *C09K 11/025* (2013.01); *H01L 51/006* (2013.01);
(Continued)

(58) Field of Classification Search
CPC ..... H01L 51/50; H01L 51/502; H01L 51/504; H01L 51/5012; H01L 51/5036;
(Continued)

(56) References Cited

U.S. PATENT DOCUMENTS

| 2012/0248968 A1 | 10/2012 | Ogiwara et al. |
| 2014/0103329 A1 | 4/2014 | Ogiwara et al. |

(Continued)

FOREIGN PATENT DOCUMENTS

| JP | 2014/96572 A | 5/2014 |
| JP | 2015-53476 A | 3/2015 |

(Continued)

OTHER PUBLICATIONS

International Search Report dated Apr. 26, 2016 in PCT/JP2016/053109 filed Feb. 2, 2016.

(Continued)

*Primary Examiner* — Chuong A Luu
(74) *Attorney, Agent, or Firm* — Oblon, McClelland, Maier & Neustadt, L.L.P.

(57) ABSTRACT

An organic electroluminescence device includes an anode, an emitting layer and a cathode, in which the emitting layer includes a first compound and a second compound, the first compound is a delayed fluorescent compound, the second compound is a fluorescent compound, an emission quantum efficiency of the first compound is 70% or less, and an ionization potential Ip1 of the first compound and an ionization potential Ip2 of the second compound satisfy a relationship of $0 \leq Ip2 - Ip1 \leq 0.8$ eV.

21 Claims, 5 Drawing Sheets

(51) Int. Cl.
*C09K 11/02* (2006.01)
*H01L 51/00* (2006.01)

(52) U.S. Cl.
CPC ........ *H01L 51/008* (2013.01); *H01L 51/0052* (2013.01); *H01L 51/0067* (2013.01); *H01L 51/0071* (2013.01); *H01L 51/0072* (2013.01); *H01L 51/0073* (2013.01); *C09K 2211/1007* (2013.01); *C09K 2211/1011* (2013.01); *C09K 2211/1014* (2013.01); *C09K 2211/1018* (2013.01); *H01L 51/0054* (2013.01); *H01L 51/5028* (2013.01); *H01L 51/5056* (2013.01); *H01L 51/5072* (2013.01); *H01L 2251/55* (2013.01); *H01L 2251/552* (2013.01)

(58) Field of Classification Search
CPC . H01L 51/005; H01L 51/0058; H01L 51/006; H01L 51/52; H01L 51/5028; H01L 51/0067; H01L 51/0071; H01L 51/0074; H01L 51/5024; H01L 51/0072; H01L 51/5056; H01L 51/5072; H01L 51/5088; H01L 51/5092; H01L 51/5096; H01L 51/5068; H01L 51/5084; C09K 11/06; C09K 11/02
USPC .......................................................... 257/40
See application file for complete search history.

(56) References Cited

U.S. PATENT DOCUMENTS

| 2014/0159023 A1* | 6/2014 | Matsumoto ......... H01L 51/0061 257/40 |
| 2015/0115225 A1 | 4/2015 | Kawamura et al. |
| 2017/0244059 A1* | 8/2017 | Sasaki ................. H01L 51/5221 |

FOREIGN PATENT DOCUMENTS

| JP | 2015-109428 A | 6/2015 |
| WO | 2012/133188 A1 | 10/2012 |
| WO | 2012/153780 A1 | 11/2012 |
| WO | 2013/038650 A1 | 3/2013 |
| WO | 2013/180241 A1 | 12/2013 |
| WO | 2014/092083 A1 | 6/2014 |
| WO | 2014/104346 A1 | 7/2014 |
| WO | 2014/157610 A1 | 10/2014 |
| WO | 2014/157619 A1 | 10/2014 |
| WO | 2014/166584 A1 | 10/2014 |
| WO | 2014/194971 A1 | 12/2014 |
| WO | 2015/060352 A1 | 4/2015 |
| WO | WO 2016/017514 A1 | 2/2016 |
| WO | WO 2016/017684 A1 | 2/2016 |
| WO | WO 2016/017688 A1 | 2/2016 |
| WO | WO 2016/017741 A1 | 2/2016 |
| WO | WO 2016/017760 A1 | 2/2016 |
| WO | 2015/098975 A1 | 7/2016 |

OTHER PUBLICATIONS

Sun, Jin Won et al., "A Fluorescent Organic Light-Emitting Diode with 50% External Quantum Efficiency," Advanced Materials, vol. 26, No. 32, 2014, 7 pages.

Nakanotani, Hajime et al., "High-efficiency organic light-emitting diodes with fluorescent emitters," Nature Communications, 2014, 4016 (DOI: 10.1038/ncomms5016), pp. 1-7.

Zhang, Dondong, et al., "Highly-Efficiency Fluorescent Organic Light-Emitting Devices Using Sensitizing Hosts with a Small Singlet-Triplet Exchange Energy," Advanced Materials, 2014, (DOI: 10.1002/adma.201401476), pp. 1-6.

Adachi, Chihaya et al., "Yuki Hando-tai no Debaisu Bussei (Device Physics of Organic Semiconductors)," Kodansha, 2012, 19 pages (with English Translation).

Uoyama, Hiroki et al., "Highly efficient organic light-emitting diodes from delayed fluorescence," Letter Research, Nature, vol. 492, Dec. 13, 2012, 7 pages.

Extended European Search Report dated Sep. 3, 2018, in European Patent Application No. 16746638.2.

Bin Huang et al., "Thermally activated delayed fluorescence materials based on 3,6-ditert-butyl-9-((phenylsulfonyl )phenyl)-9H-carbazoles", Dyes and Pigments, Elsevier Applied Science Publishers, Barking, GB, vol. 111, Jun. 16, 2014, pp. 135-144.

Jie Zhou et al., "Charge-transfer-featured materials-promising hosts for fabrication of efficient OLEDs through triplet harvesting via triplet fusion" Chemical Communications, vol. 50, No. 57, Jul. 21, 2014, pp. 7586-7589.

* cited by examiner

ORGANIC ELECTROLUMINESCENCE ELEMENT AND ELECTRONIC DEVICE

TECHNICAL FIELD

The present invention relates to an organic electroluminescence device and an electronic device.

BACKGROUND ART

When a voltage is applied to an organic electroluminescence device (hereinafter, occasionally referred to as "organic EL device"), holes and electrons are injected into an emitting layer respectively from an anode and a cathode. The injected holes and electrons are recombined to generate excitons in the emitting layer. According to the electron spin statistics theory, singlet excitons are generated at a ratio of 25% and triplet excitons are generated at a ratio of 75%.

A fluorescent organic EL device, which uses emission caused by singlet excitons, is applied to a full color display of a mobile phone, a TV set and the like. It has been studied to further improve a performance of the fluorescent organic EL device. For instance, in order to further improve a luminous efficiency, an organic EL device with use of singlet excitons and triplet excitons has been studied.

An organic EL device using delayed fluorescence has been proposed and studied, for instance, a thermally activated delayed fluorescence (TADF) mechanism has been studied. The TADF mechanism uses such a phenomenon that inverse intersystem crossing from triplet excitons to singlet excitons thermally occurs when a material having a small energy gap ($\Delta ST$) between singlet energy level and triplet energy level is used. As for thermally activated delayed fluorescence, refer to, for instance. "ADACHI, Chihaya, ed. (Mar. 22, 2012), "Yuki Hando-tai no Debaisu Bussei (Device Physics of Organic Semiconductors)", Kodansha, pp. 261-262."

For instance, non-Patent Literatures 1 and 2 also disclose organic EL devices using the TADF mechanism.

CITATION LIST

Non-Patent Literature(s)

Non-Patent Literature 1: Hajime Nakanotani, et al (9 persons), "High-Efficiency organic light-emitting diodes with fluorescent emitters", NATURE COMMUNICATIONS, in May 30, 2014, 5, 4016 (DOI: 10.1038/ncomms5016)

Non-Patent Literature 2: Dongdong Zhang, et al (6 persons), "High-Efficiency Fluorescent Organic Light-Emitting Devices Using Sensitizing Hosts with a Small Singlet-Triplet Exchange Energy", ADVANCED MATERIALS. 2014 (DOI: 10.1002/adma.201401476)

SUMMARY OF THE INVENTION

Problems to be Solved by the Invention

An object of the invention is to provide an organic electroluminescence device capable of prolonging a lifetime, improving a luminous efficiency, and inhibiting a roll-off when driven at a high current density, and an electronic device including the organic electroluminescence device.

Means for Solving the Problems

According to an aspect of the invention, an organic electroluminescence device includes an anode, an emitting layer and a cathode, in which the emitting layer includes a first compound and a second compound, the first compound is a delayed fluorescent compound, the second compound is a fluorescent compound, an emission quantum efficiency of the first compound is 70% or less, and an ionization potential Ip1 of the first compound and an ionization potential Ip2 of the second compound satisfy a relationship of $0 \leq Ip2-Ip1 \leq 0.8$ eV (Numerical Formula 1).

According to another aspect of the invention, an organic electroluminescence device includes an anode, an entitling layer and a cathode, in which the entitling layer includes a first compound and a second compound, the first compound is a delayed fluorescent compound, the second compound is a fluorescent compound, and an ionization potential Ip1 of the first compound and an ionization potential Ip2 of the second compound satisfy a relationship of $0 \leq Ip2-Ip1 \leq 0.3$ eV (Numerical Formula 3).

According to another aspect of the invention, an electronic device includes the organic electroluminescence device according to the above aspect.

According to the above aspect of the invention, an organic electroluminescence device capable of prolonging a lifetime, improving a luminous efficiency, and inhibiting a roll-off when driven at a high current density, and an electronic device including the organic electroluminescence device can be provided.

DESCRIPTION OF EMBODIMENTS

First Exemplary Embodiment

Arrangement(s) of an organic EL device according to a first exemplary embodiment of the invention will be described below.

The organic EL device includes an anode, a cathode and an organic layer disposed therebetween. The organic layer includes one or more layers formed of an organic compound. The organic Layer may further contain an inorganic compound. The organic layer of the organic EL device of the exemplary embodiment includes at least one emitting layer. For instance, the organic layer may consist of the emitting layer, or may include one of layers usable in a typical organic EL device, such as a hole injecting layer, a hole transporting layer, an electron injecting layer, an electron transporting layer, a hole blocking layer and an electron blocking layer.

Figure 1:
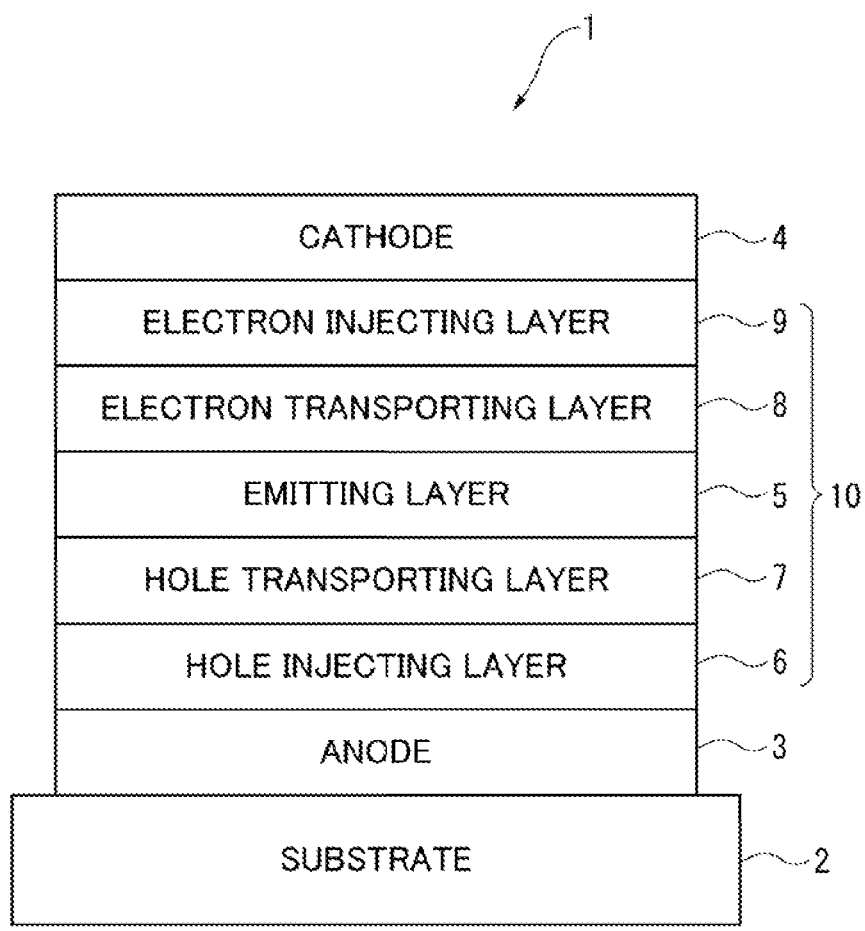
FIG. 1 schematically shows an exemplary arrangement of an organic electroluminescence device according to a first exemplary embodiment.

FIG. 1 schematically shows an exemplary arrangement of the organic EL device according to the exemplary embodiment. An organic EL device 1 includes a light-transmissive substrate 2, an anode 3, a cathode 4, and an organic layer 10 provided between the anode 3 and the cathode 4. The organic layer 10 include a hole injecting layer 6, a hole transporting layer 7, an emitting layer 5, an electron transporting layer 8, and an electron injecting layer 9 which are laminated on the anode 3 in this order.

Emitting Layer

The emitting layer of the organic EL device includes a first compound and a second compound. The emitting layer may contain a metal complex, but preferably contains no phosphorescent metal complex in the exemplary embodiment.

First Compound

The first compound in the exemplary embodiment is a delayed fluorescent compound.

An emission quantum efficiency of the first compound is 70% or less. The emission quantum efficiency of the first compound is preferably 65% or less, more preferably 60% or less. The emission quantum efficiency of the first compound is preferably more than 0%, more preferably 30% or more.

The first compound in the exemplary embodiment is not a metal complex. The first compound is preferably represented by a formula (1).

[Formula 1]

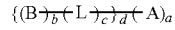
(1)

In the formula (1), A is an acceptor moiety and is a group having a partial structure selected from partial structures represented by formulae (a-1) to (a-7). When a plurality of A are present, the plurality of A may be mutually the same or different and may be combined to form a saturated or unsaturated ring. B is a donor moiety and has one selected from partial structures represented by formulae (b-1) to (b-6). When a plurality of B are present, the plurality of B may be mutually the same or different and may be combined to form a saturated or unsaturated ring. a, b and d are each independently an integer from 1 to 5. c is an integer from 0 to 5. When c is 0, A is bonded to B by a single bond or a spiro bond. When c is an integer from 1 to 5, L is a linking group selected from the group consisting of a substituted or unsubstituted aromatic hydrocarbon group having 6 to 30 ring carbon atoms and a substituted or unsubstituted heterocyclic group having 5 to 30 ring atoms. When a plurality of L are present, the plurality of L may be mutually the some or different and may be combined to form a saturated or unsaturated ring.

[Formula 2]

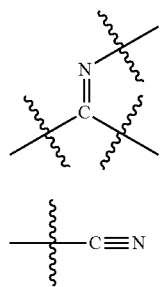

(a-1)

(a-2)

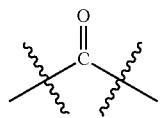 (a-3)

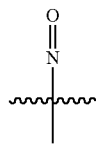 (a-4)

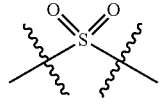 (a-5)

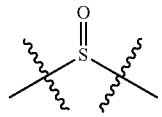 (a-6)

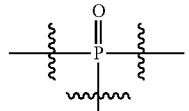 (a-7)

[Formula 3]

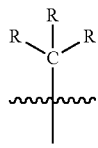 (b-1)

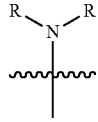 (b-2)

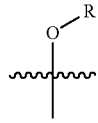 (b-3)

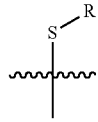 (b-4)

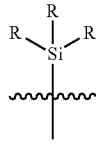 (b-5)

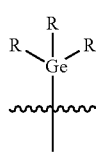 (b-6)

In the formula (b-1) to (b-6), R is each independently a hydrogen atom or a substituent. When R is a substituent, the substituent is selected from the group consisting of a substituted or unsubstituted aromatic hydrocarbon group having 6 to 30 ring carbon atoms, a substituted or unsubstituted heterocyclic group having 5 to 30 ring atoms, and a substituted or unsubstituted alkyl group having 1 to 30 carbon atoms. When a plurality of R are present, the plurality of R may be mutually the same or different and may be combined to form a saturated or unsaturated ring.

A bonding pattern of the compound represented by the formula (1) is exemplified by bonding patterns shown below in Table 1.

TABLE 1

| No. | a | b | c | d | Bonding Pattern |
|---|---|---|---|---|---|
| (1A) | 1 | 1 | 0 | 1 | B—A |
| (1B) | 1 | 1 | 1 | 1 | B—L—A |
| (1C) | 2 | 1 | 0 | 1 | B—A—A, B(—A)(—A) |
| (1D) | 1 | 2 | 0 | 1 | B—B—A, B(—A)(—B) |
| (1E) | 2 | 1 | 1 | 1 | B—L—A—A, B—L(—A)(—A) |
| (1F) | 1 | 2 | 1 | 1 | B—B—L—A, B(—L—A)(—B) |
| (1G) | 1 | 1 | 2 | 1 | B—L—L—A |
| (1H) | 1 | 1 | 1 | 2 | B—L(—A)(—A), B—L—B—L—A |

Manufacturing Method of First Compound

The first compound can be manufactured by a method described in International Publication No. WO2013/180241. International Publication No. WO2014/092083, International Publication No. WO2014/104346 and the like.

Delayed Fluorescence

Delayed fluorescence (thermally activated delayed fluorescence) is explained in "ADACHI, Chihaya, ed., "Yuki Hando-tai no Debaisu Bussei (Device Physics of Organic Semiconductors)" Kodansha, pp. 261-268." According to this literature, when an energy gap $\Delta E_{13}$ between the singlet state and the triplet state of a fluorescent material can be reduced, inverse energy transfer from the triplet state to the singlet state, which usually occurs at a low transition probability, occurs at a high transition probability to cause thermally activated delayed fluorescence (TADF). Further, FIG. 10.38 in this literature illustrates an occurrence mechanism of the delayed fluorescence. The first compound of the exemplary embodiment is a compound exhibiting thermally activated delayed fluorescence caused by this mechanism. Occurrence of delayed fluorescence emission can be determined by transient PL (Photo Luminescence) measurement.

The behavior of delayed fluorescence can be analyzed based on the decay curve obtained by the transient PL measurement. The transient PL measurement is a process where a sample is irradiated with a pulse laser to be excited, and a decay behavior (transient characteristics) of PL emission after the irradiation is stopped is measured. PL emission using a TADF material is divided into an emission component from singlet excitons generated by the first PL excitation and an emission component from singlet excitons generated via triplet excitons. The lifetime of the singlet excitons generated by the first PL excitation is in a nanosecond order and considerably short. Emission from these singlet excitons thus decays immediately after the irradiation with the pulse laser.

In contrast, delayed fluorescence, which is emission from the singlet excitons generated via long-life triplet excitons, decays slowly. There is thus a large difference in time between emission from the singlet excitons generated by the first PL excitation and emission from the singlet excitons generated via triplet excitons. Therefore, a luminous intensity resulting from the delayed fluorescence can be obtained.

Figure 2:
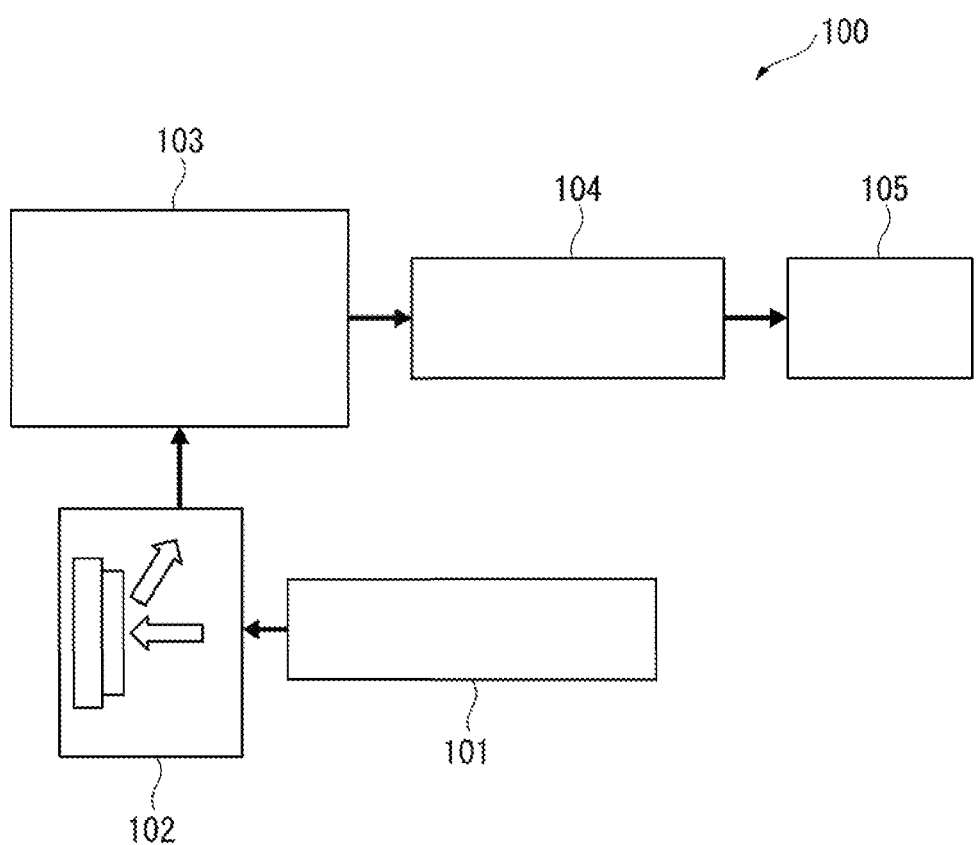
FIG. 2 schematically shows a device for measuring transient PL.

FIG. 2 schematically shows an exemplary device for measuring transient PL.

A transient PL measuring device 100 of the exemplary embodiment includes: a pulse laser 101 capable of emitting light with a predetermined wavelength; a sample chamber 102 configured to house a measurement sample; a spectrometer 103 configured to disperse light emitted from the measurement sample; a streak camera 104 configured to form a two-dimensional image; and a personal computer 105 configured to analyze the two-dimensional image imported thereinto. It should be noted that transient PL may be measured by a device different from one described in the exemplary embodiment.

The sample to be housed in the sample chamber 102 is prepared by forming a thin film, which is made of a matrix material doped with a doping material at a concentration of 12 mass %, on a quartz substrate.

The thus-obtained thin film sample is housed in the sample chamber 102, and is irradiated with a pulse laser emitted from the pulse laser 101 to excite the doping material. The emitted excitation light is taken in a 90-degree direction with respect to the irradiation direction of the excitation light, and is dispersed by the spectrometer 103. A two-dimensional image of the light is formed through the streak camera 104. In the thus-obtained two-dimensional image, an ordinate axis corresponds to time, an abscissa axis corresponds to wavelength, and a bright spot corresponds to luminous intensity. The two-dimensional image is taken at a predetermined time axis, thereby obtaining an emission spectrum with an ordinate axis representing luminous intensity and an abscissa axis representing wavelength. Further, the two-dimensional image is taken at a wavelength axis, thereby obtaining a decay curve (transient PL) with an ordinate axis representing the logarithm of luminous intensity and an abscissa axis representing time.

For instance, a thin film sample A was prepared using a reference compound M1 below as a matrix material and a reference compound DP1 below as a doping material, and transient PL was measured.

[Formula 4]

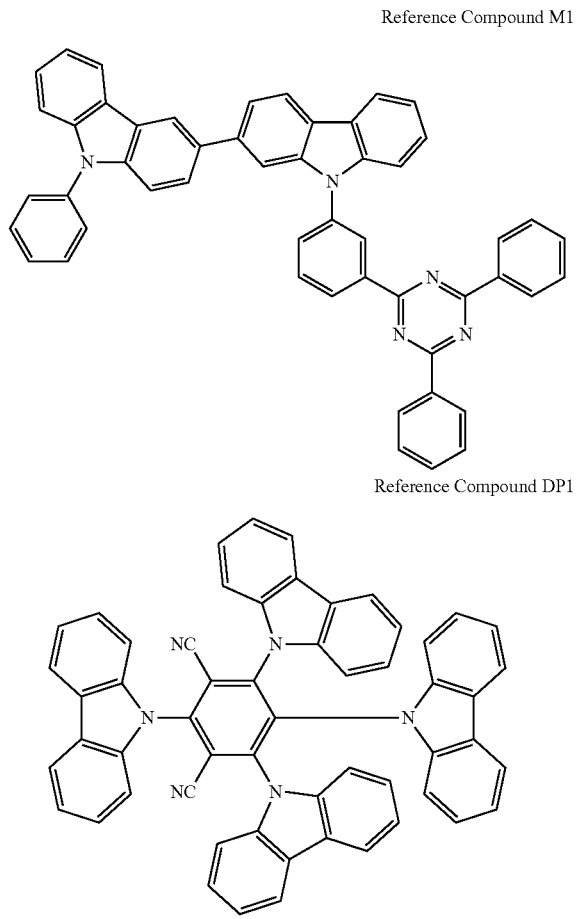

Reference Compound M1

Reference Compound DP1

Respective decay curves of the thin film sample A and a thin film sample B were analyzed. The thin film sample B was prepared in the same manner as described above using a reference compound M2 below as a matrix material and the reference compound DP1 as a doping material.

Figure 3:
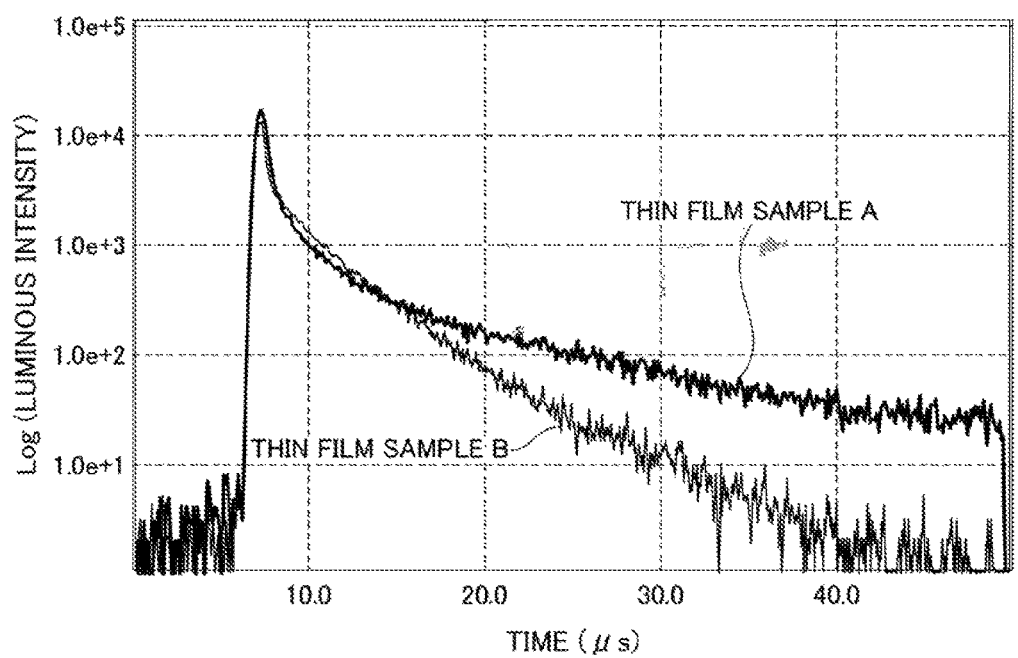
FIG. 3 shows examples of a transient PL decay curve.

FIG. 3 shows a decay curve obtained from transient PL measured using each of the thin film samples A and B.

[Formula 5]

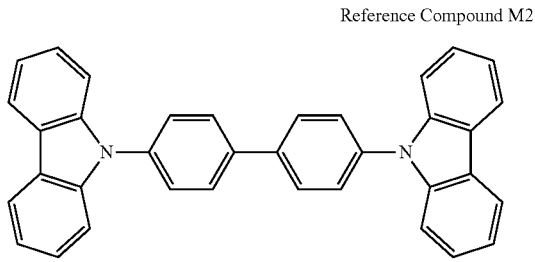

Reference Compound M2

As described above, an emission decay curve with an ordinate axis representing luminous intensity and an abscissa axis representing time can be obtained by the transient PL measurement. Based on the emission decay curve, a fluorescence intensity ratio between fluorescence emitted from a singlet state generated by photo-excitation and delayed fluorescence emitted from a singlet state generated by inverse energy transfer via a triplet state can be estimated. In a delayed fluorescent material, a ratio of the intensity of the slowly decaying delayed fluorescence to the intensity of the promptly decaying fluorescence is relatively large.

In the exemplary embodiment, the luminescence amount of the delayed fluorescence can be obtained using the device shown in FIG. 2. Emission from the first compound includes: Prompt emission observed immediately when the excited slate is achieved by exciting the first compound with a pulse beam (i.e., a beam emitted from a pulse laser) having an absorbable wavelength; and Delay emission observed not immediately when but after the excited state is achieved. In the exemplary embodiment, the amount of Delay emission is preferably 5% or more relative to the amount of Prompt emission.

The amount of Prompt emission and the amount of Delay emission can be obtained in the same method as a method described in "Nature 492, 234-238, 2012." The amount of Prompt emission and the amount of Delay emission may be calculated using a device different from one described in the above Literature.

For instance, a sample usable for measuring the delayed fluorescence may be prepared by co-depositing the first compound and a compound TH-2 below on a quartz substrate at a ratio of the first compound being 12 mass % to form a 100-nm-thick thin film.

[Formula 6]

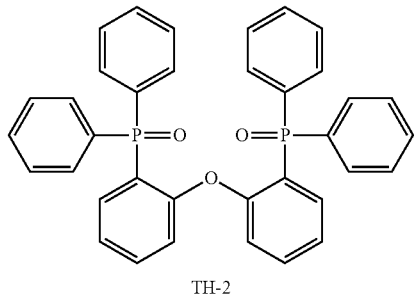

TH-2

Second Compound

The second compound in the exemplary embodiment is a fluorescent compound.

The second compound preferably emits fluorescence having a main peak wavelength (occasionally referred to as an emission peak wavelength) of 550 nm or less. Moreover, the second compound preferably emits fluorescence having the main peak wavelength of 430 nm or more. The main peak wavelength means a peak wavelength of luminescence spectrum exhibiting a maximum luminous intensity among luminous spectra measured using a toluene solution where the second compound is dissolved at a concentration from $10^{-6}$ mol/l to $10^{-5}$ mol/l.

The second compound preferably emits a green or blue fluorescence. The second compound is preferably a material exhibiting a high emission quantum efficiency.

The second compound of the exemplary embodiment may be a fluorescent material. Examples of the fluorescent dopant material include a bisarylamino naphthalene derivative, an aryl-substituted naphthalene derivative, a bisarylamino anthracene derivative, an aryl-substituted anthracene derivative, a bisarylamino pyrene derivative, an aryl-substituted pyrene derivative, a bisarylamino chrysene derivative, an aryl-substituted chrysene derivative, a bisarylamino fluoranthene derivative, an aryl-substituted fluoranthene derivative, an indenoperylene derivative, a pyrromethene boron complex compound, a compound having a pyrromethene skeleton or a metal complex thereof, a diketopyrrolopyrrole derivative, and a perylene derivative.

The second compound of the exemplary embodiment may be a compound represented by a formula (10) below.

[Formula 7]

$$(A_D)_{\overline{pa}}(B_D)_{pb} \quad (10)$$

In the formula (10), $A_D$ is a substituted or unsubstituted aromatic hydrocarbon group having 12 to 50 ring carbon atoms. Examples of the aromatic hydrocarbon group having 12 to 50 ring carbon atoms in $A_D$ include groups derived from naphthalene, anthracene, benzanthracene, phenanthrene, chrysene, pyrene, fluoranthene, benzofluoranthene, perylene, picene, triphenylene, fluorene, benzofluorene, stilbene and naphthacene, and further include benzo groups and ring-expanded groups of the aromatic hydrocarbon groups.

In the formula (10), $B_D$ is represented by a formula (11) below.

In the formula (10), pa is an integer of 1 to 4, and pb is an integer of 0 to 4.

[Formula 8]

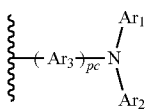

(11)

In the formula (11), $Ar_1$, $Ar_2$ and $Ar_3$ each independently represent a substituent selected from the group consisting of a substituted or unsubstituted aromatic hydrocarbon group having 6 to 50 ring carbon atoms, substituted or unsubstituted alkyl group having 1 to 50 carbon atoms, substituted or unsubstituted alkenyl group, substituted or unsubstituted alkynyl group, and substituted or unsubstituted heterocyclic group having 5 to 50 atoms forming a ring (i.e., ring atoms), and pc is an integer of 0 to 4. A wavy line in the formula (11) shows a bonding position with the aromatic hydrocarbon group represented by $A_D$.

In the formulae (10) and (11), a plurality of $A_D$ may be mutually the same or different, a plurality of $B_D$ may be mutually the same or different, a plurality of pa may be mutually the same or different, a plurality of pb may be mutually the same or different, a plurality of $Ar_1$ may be mutually the same or different, a plurality of $Ar_2$ may be mutually the same or different, a plurality of $Ar_3$ may be mutually the same or different, and a plurality of pc may be mutually the same or different.

Examples of the compound represented by the formula (10) include the following compounds, but the second compound is not limited thereto. In the following compounds, $A_{D1}$ to $A_{D4}$ each independently represent the same as $A_D$, and $B_{D1}$ to $B_{D4}$ each independently represent the same as $B_D$.

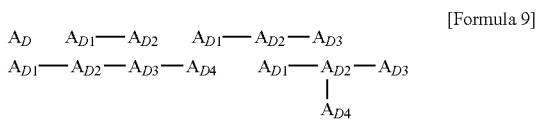

[Formula 9]

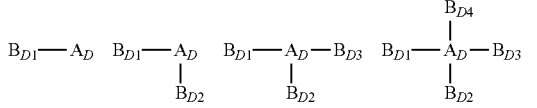

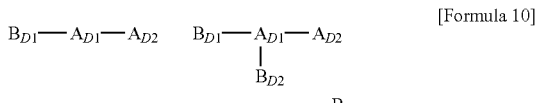

[Formula 10]

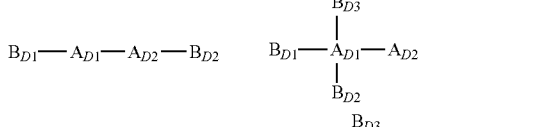

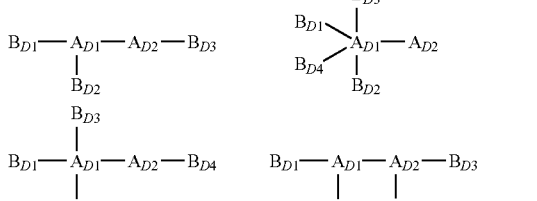

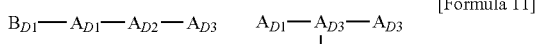

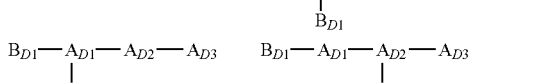

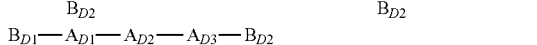

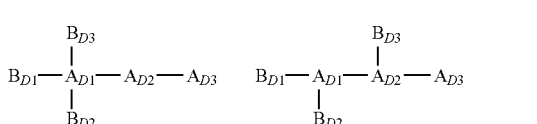

[Formula 11]

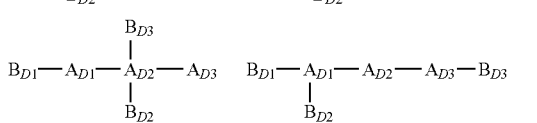

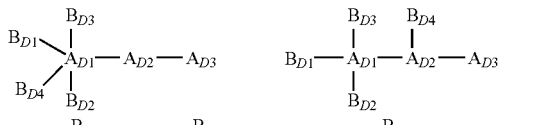

[Formula 12]

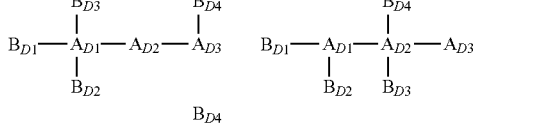

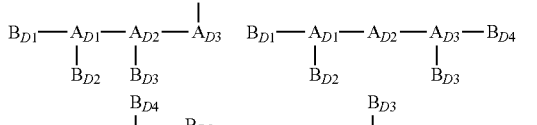

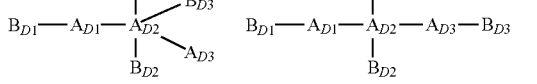

[Formula 13]

[Formula 14]

[Formula 15]

The aromatic hydrocarbon group in $A_D$ is preferably an aromatic hydrocarbon group having 12 to 24 ring carbon atoms, more preferably an aromatic hydrocarbon group having 18 to 20 ring carbon atoms. Examples of the aromatic hydrocarbon group in $A_D$ includes a naphthylphenyl group, naphthyl group, acenaphthylenyl group, anthryl group, benzanthryl group, aceanthryl group, phenanthryl group, benzo(c)phenanthryl group, phenalenyl group, fluorenyl group, picenyl group, pentaphenyl group, pyrenyl group, chrysenyl group, benzo[g]chrysenyl group, s-indecenyl group, as-indecenyl group, fluoranthenyl group, benzo[k]fluoranthenyl group, triphenylenyl group, benzo[b]triphenylenyl group, benzofluorenyl group, styrylphenyl group, naphthacenyl group, perylenyl group, and ring-expanded group thereof; preferably, anthryl group, picenyl group, pyrenyl group, chrysenyl group, fluoranthenyl group, benzo[k]fluoranthenyl group, benzofluorenyl group, styrylphenyl group, naphthacenyl group, perylenyl group, and benzo groups or ring-expanded groups thereof; more preferably, anthryl group, pyrenyl group, chrysenyl group, benzo[k]fluoranthenyl group, benzofluorenyl group, styrylphenyl group, and benzo groups or ring-expanded groups thereof; particularly preferably, anthryl group, pyrenyl group, chrysenyl group, benzo[k]fluoranthenyl group, and benzofluorenyl group.

The aromatic hydrocarbon groups in $Ar_1$, $Ar_2$ and $Ar_3$ are each independently an aromatic hydrocarbon group having 6 to 24 ring carbon atoms, more preferably an aromatic hydrocarbon group having 6 to 12 ring carbon atoms. The aromatic hydrocarbon groups in $Ar_1$, $Ar_2$ and $Ar_3$ may each independently be any one of a phenyl group, naphthylphenyl group, biphenylyl group, terphenylyl group, naphthyl group, acenaphthylenyl group, anthryl group, benzoanthryl group, aceanthryl group, phenanthryl group, benzo[c]phenanthryl group, phenalenyl group, fluorenyl group, picenyl group, pentaphenyl group, pyrenyl group, chrysenyl group, benzo[g]chrysenyl group, s-indacenyl group, as-indacenyl group, fluoranthenyl group, benzo[k]fluoranthenyl group, triphenylenyl group, benzo[b]triphenylenyl group, benzofluorenyl group, styrylphenyl group, naphthacenyl group and perylenyl group, and benzo groups and ring-expanded groups of these groups, among which a phenyl group, biphenyl group, terphenylyl group and naphthyl group are preferable, phenyl group, biphenyl group and terphenylyl group are more preferable, and a phenyl group is especially preferable.

Examples of the substituted aromatic hydrocarbon group include a phenylnaphthyl group, naphthylphenyl group, tolyl group, xylyl group, silylphenyl group, trimethylsilylphenyl group, 9,9-dimethylfluorenyl group, 9,9-diphenylfluorenyl group, 9,9'-spirobifluorenyl group and cyanophenyl group, among which, for instance, a tolyl group, xylyl group, trimethylsilylphenyl group, 9,9-dimethylfluorenyl group, 9,9-diphenylfluorenyl group, 9,9'-spirobifluorenyl group, cyanophenyl group and silylphenyl group are preferable.

The alkyl group(s) in $Ar_1$, $Ar_2$ and $Ar_3$ is preferably each independently an alkyl group having 1 to 10 carbon atoms, and more preferably an alkyl group having 1 to 5 carbon atoms. Examples of the alkyl group(s) in $Ar_1$, $Ar_2$ and $Ar_3$ include a methyl group, ethyl group, n-propyl group, isopropyl group, n-butyl group, isobutyl group, s-butyl group, t-butyl group, pentyl group (including isomers thereof), hexyl group (including isomers thereof), heptyl group (including isomers thereof), octyl group (including isomers thereof), nonyl group (including isomers thereof), decyl group (including isomers thereof), undecyl group (including isomers thereof) and dodecyl group (including isomers thereof), among which a methyl group, ethyl group, n-propyl group, isopropyl group, n-butyl group, isobutyl group, s-butyl group, t-butyl group and pentyl group (including isomers thereof) are preferable, a methyl group, ethyl group, n-propyl group, isopropyl group, n-butyl group, isobutyl group, s-butyl group and t-butyl group are more preferable, and a methyl group, ethyl group, isopropyl group and t-butyl group are especially preferable.

The alkyl group(s) in $Ar_1$, $Ar_2$ and $Ar_3$ may each independently be a cycloalkyl group having 3 to 50 ring carbon atoms. The cycloalkyl group(s) in $Ar_1$, $Ar_2$ and $Ar_3$ is preferably each independently a cycloalkyl group having 3 to 6 ring carbon atoms, and more preferably a cycloalkyl group having 5 or 6 ring carbon atoms. Examples of the cycloalkyl group(s) in $Ar_1$, $Ar_2$ and $Ar_3$ include a cyclopropyl group, cyclobutyl group, cyclopentyl group, cyclohexyl group, cycloheptyl group, cyclooctyl group and adamantyl group, among which a cyclopentyl group and cyclohexyl group are preferable.

The alkenyl group(s) in $Ar_1$, $Ar_2$ and $Ar_3$ is preferably each independently an alkenyl group having 2 to 20 carbon atoms, and more preferably an alkenyl group having 2 to 10 carbon atoms. Examples of the alkenyl group(s) in $Ar_1$, $Ar_2$ and $Ar_3$ include a vinyl group, allyl group, 1-butenyl group, 2-butenyl group, 3-butenyl group, 1,3-butanedienyl group, 1-methylvinyl group, 1-methylallyl group, 1,1-dimethylallyl group, 2-methylallyl group and 1,2-dimethylallyl group.

Examples of the substituted alkenyl group include a styryl group, 2,2-diphenylvinyl group, 1,2-diphenylvinyl group, 1-phenylallyl group, 2-phenylallyl group, 3-phenylallyl group, 3,3-diphenylallyl group, 1-phenyl-1-butenyl group and 3-phenyl-1-butenyl group.

The alkynyl group(s) in $Ar_1$, $Ar_2$ and $Ar_3$ is preferably each independently an alkynyl group having 2 to 20 carbon atoms, and more preferably an alkynyl group having 2 to 10 carbon atoms. The alkynyl group(s) in $Ar_1$, $Ar_2$ and $Ar_3$ may be a propargyl group or a 3-pentynyl group.

The heterocyclic group(s) in $Ar_1$, $Ar_2$ and $Ar_3$ is preferably each independently a heterocyclic group having 5 to 24 ring atoms, and more preferably a heterocyclic group having 5 to 18 ring atoms. The heterocyclic group(s) in $Ar_1$, $Ar_2$ and $Ar_3$ may be a heterocyclic group having 1 to 5 hetero atoms (e.g., nitrogen atom, oxygen atom and sulfur atom). The heterocyclic group(s) in $Ar_1$, $Ar_2$ and $Ar_3$ may each independently be any one of a pyrrolyl group, furyl group, thienyl group, pyridyl group, pyridazynyl group, pyrimidinyl group, pyrazinyl group, triazinyl group, imidazolyl group, oxazolyl group, thiazolyl group, pyrazolyl group, isooxazolyl group, isothiazolyl group, oxadiazolyl group, thiadiazolyl group, triazolyl group, tetorazolyl group, indolyl group, isoindolyl group, benzofuranyl group, isobenzofuranyl group, benzothiophenyl group, isobenzothiophenyl group, indolizinyl group, quinolizinyl group, quinolyl group, isoquinolyl group, cinnolinyl group, phthalazinyl group, quinazolinyl group, quinoxalinyl group, benzimidazolyl group, benzoxazolyl group, benzothiazolyl group, indazolyl group, benzisoxazolyl group, benzisothiazolyl group, dibenzofuranyl group, dibenzothiophenyl group, carbazolyl group, phenanthridinyl group, acridinyl group, phenanthrolinyl group, phenazinyl group, phenothiazinyl group, phenoxazinyl group and xanthenyl group, among which a furyl group, thienyl group, pyridyl group, pyridazynyl group, pyrimidinyl group, pyrazinyl group, triazinyl group, benzofuranyl group, benzothiophenyl group, dibenzofuranyl group and dibenzothiophenyl group are preferable, and a benzofuranyl group, benzothiophenyl group, dibenzofuranyl group and dibenzothiophenyl group are more preferable.

Any substituent in a "substituted or unsubstituted" compound represented by the formula (10) is preferably selected from the group consisting of an alkyl group having 1 to 50 (preferably 1 to 10, more preferably 1 to 5) carbon atoms, an alkenyl group having 2 to 20 (preferably 2 to 10) carbon atoms, an alkynyl group having 2 to 20 (preferably 2 to 10) carbon atoms, a cycloalkyl having 3 to 50 (preferably 3 to 6, more preferably 5 or 6) ring carbon atoms, an aromatic hydrocarbon group having 6 to 50 (preferably 6 to 24, more preferably 6 to 12) ring carbon atoms, an aralkyl group having 1 to 50 (preferably 1 to 10, more preferably 1 to 5) carbon atoms containing an aromatic hydrocarbon group having 6 to 50 (preferably 6 to 24, more preferably 6 to 12) ring carbon atoms, an amino group, a monoalkylamino or dialkylamino group having an alkyl group having 1 to 50 (preferably 1 to 10, more preferably 1 to 5) carbon atoms, a monoarylamino or diarylamino group having an aromatic hydrocarbon group having 6 to 50 (preferably 6 to 24, and more preferably 6 to 12) ring carbon atoms, an alkoxy group having an alkyl group having 1 to 50 (preferably 1 to 10, more preferably 1 to 5) carbon atoms, on aryloxy group having an aromatic hydrocarbon group having 6 to 50 (preferably 6 to 24, and more preferably 6 to 12) ring carbon atoms, an alkylthio group having an alkyl group having 1 to 50 (preferably 1 to 10, more preferably 1 to 5) carbon atoms, an arylthio group having an aromatic hydrocarbon group having 6 to 50 (preferably 6 to 24, and more preferably 6 to 12) ring carbon atoms, a monosubstituted, disubstituted or trisubstituted silyl group having a group selected from an alkyl group having 1 to 50 (preferably 1 to 10, more preferably 1 to 5) carbon atoms and an aromatic hydrocarbon group having 6 to 50 (preferably 6 to 24, more preferably 6 to 12) ring carbon atoms, a heterocyclic group having 5 to 50 (preferably 5 to 24, more preferably 5 to 18) ring atoms and 1 to 5 (preferably 1 to 3, more preferably 1 or 2) hetero atoms (e.g., a nitrogen atom, oxygen atom and sulfur atom), a haloalkyl group having 1 to 50 carbon atoms (preferably 1 to 10, and more preferably 1 to 5 carbon atoms), a halogen atom (e.g., a fluorine atom, chlorine atom, bromine atom or iodine atom, preferably a fluorine atom), a cyano group, and a nitro group.

Among the above substituents, a substituent selected from the group consisting of an alkyl group having 1 to 5 carbon atoms, cycloalkyl group having 5 or 6 carbon atoms, aromatic hydrocarbon group having 6 to 12 ring carbon atoms, and heterocyclic group having 5 to 24 ring atoms and 1 to 3 hetero atoms (a nitrogen atom, oxygen atom and sulfur atom) is particularly preferable.

An alkyl group having 1 to 50 carbon atoms as a substituent in the substituted or unsubstituted group represents the same as those described as the alkyl group in $Ar_1$, $Ar_2$ and $Ar_3$.

An alkenyl group having 2 to 20 carbon atoms as a substituent in the substituted or unsubstituted group represents the same as those described as the alkenyl group in $Ar_1$, $Ar_2$ and $Ar_3$.

An alkynyl group having 2 to 20 carbon atoms as a substituent in the substituted or unsubstituted group represents the same as those described as the alkynyl group in $Ar_1$, $Ar_2$ and $Ar_3$.

A cycloalkyl group having 3 to 50 ring carbon atoms as a substituent in the substituted or unsubstituted group represents the same as those described as the cycloalkyl group in $Ar_1$, $Ar_2$ and $Ar_3$.

An aromatic hydrocarbon group having 6 to 50 ring carbon atoms as a substituent in the substituted or unsubstituted group represents the same as those described as the aromatic hydrocarbon group in $Ar_1$, $Ar_2$ and $Ar_3$.

An aralkyl group having 6 to 50 ring carbon atoms as a substituent in the substituted or unsubstituted group includes on aromatic hydrocarbon group having 6 to 50 ring carbon atoms and an aralkyl group having 1 to 50 carbon atoms. Examples of an alkyl group moiety are the same as the above-described examples of the alkyl group. Examples of an aromatic hydrocarbon group moiety are the same as the above-described examples of the aromatic hydrocarbon group.

In a monoalkylamino group or a dialkylamino group as a substituent in the substituted or unsubstituted group, examples of an alkyl group moiety are the same as the above-described examples of the alkyl group.

In a monoarylamino group or a diarylamino group as a substituent in the substituted or unsubstituted group, examples of an aryl group (aromatic hydrocarbon group) moiety are the same as the above-described examples of the aromatic hydrocarbon group.

In an alkoxy group as a substituent in the substituted or unsubstituted group, examples of an alkyl group moiety are the same as the above-described examples of the alkyl group. For instance, the alkoxy group is preferably a methoxy group and an ethoxy group.

In an aryloxy group as a substituent in the substituted or unsubstituted group, examples of an aryl group (aromatic hydrocarbon group) moiety are the same as the above-described examples of the aromatic hydrocarbon group. The aryloxy group is exemplified by a phenoxy group.

In an alkylthio group as a substituent in the substituted or unsubstituted group, examples of an alkyl group moiety are the same as the above-described examples of the alkyl group.

In an arylthio group as a substituent in the substituted or unsubstituted group, examples of an aryl group (aromatic hydrocarbon group) moiety are the same as the above-described examples of the aromatic hydrocarbon group.

Examples of a mono-substituted silyl group, di-substituted silyl group or trisubstituted silyl group as a substituent in the substituted or unsubstituted group include an alkylsilyl group having 1 to 50 carbon atoms and an arylsilyl group having 6 to 50 ring carbon atoms. Examples of the alkylsilyl group having 1 to 50 carbon atoms include a monoalkylsilyl group, dialkylsilyl group and trialkylsilyl group. Specific examples of the alkyl group in each of those are the same as the above-described examples of the alkyl group. Examples of the arylsilyl group having 6 to 50 ring carbon atoms include a monoarylsilyl group, diarylsilyl group and triarylsilyl group. Specific examples of each aryl group in the arylsilyl group, which are the same as later-described examples of the aryl group, include a trimethylsilyl group, triethylsilyl group, t-butyldimethylsilyl group, vinyldimethylsilyl group, propyldimethylsilyl group, isopropyldimethylsilyl group, triphenylsilyl group, phenyldimethylsilyl group, t-butyldiphenylsilyl group and tritolylsilyl group.

A heterocyclic group as a substituent in the substituted or unsubstituted group represents the same as those described as the aromatic heterocyclic group in $Ar_1$, $Ar_2$ and $Ar_3$.

A haloalkyl group as a substituent in the substituted or unsubstituted group is exemplified by a group obtained by halogenating the above-described alkyl group, specifically, trifluoromethyl group.

Combination of First Compound and Second Compound

The organic EL device in the exemplary embodiment is capable of prolonging a lifetime, improving a luminous efficiency, and inhibiting a roll-off when driven at a high current density. The roll-off refers to a phenomenon in which a luminous efficiency is decreased when the organic EL device is driven at a high current density.

The first compound contained in the emitting layer in the exemplary embodiment is a delayed fluorescent compound. Since the delayed fluorescent compound has a donor (electron-donating) moiety and an acceptor (electron accepting) moiety in a molecular structure, electric charges exist in a localized state in a molecule of the delayed fluorescent compound when the delayed fluorescent compound is excited. Since such a localized state of the electric charges possibly causes various side reactions, the delayed fluorescent compound having a long excited lifetime tends to exhibit a low stability especially in the excited state. Moreover, a half bandwidth of the luminescence spectrum of the delayed fluorescent compound is increased. Accordingly, it is difficult to use the delayed fluorescent compound as a luminescent material for a display unit requiring a high definition display in a large-sized TV set and the like.

Accordingly, an organic EL device including an emitting layer containing a delayed fluorescent compound and a fluorescent compound has been studied. In the organic EL device with the above arrangement, the delayed fluorescent compound is used as a sensitizer in the emitting layer and the fluorescent compound is used as the luminescent material. According to live organic EL device with the above arrangement, since the fluorescent compound emits light, it is expected that the half bandwidth of the luminescence spectrum is decreased. Moreover, since emission from the delayed fluorescent compound having a low excitation stability can be avoided, it is expected that a lifetime of the organic EL device is prolonged. Further, according to the organic EL device with this arrangement, it is theoretically expected that the same luminous efficiency as that of an organic EL device including an emitting layer containing a delayed fluorescent compound as a luminescent material is obtained.

The inventors have found that a combination of the delayed fluorescent compound that is the first compound and the fluorescent compound that is the second compound under predetermined conditions can provide advantages of prolonging a lifetime, improving a luminous efficiency, and inhibiting a roll-off in a high current density region.

In the exemplary embodiment, an ionization potential Ip1 of the first compound and an ionization potential Ip2 of the second compound preferably satisfy a numerical formula below (Numerical Formula 1), further preferably satisfy a numerical formula below (Numerical Formula 1A).

$$0 \leq Ip2-Ip1 \leq 0.8 \text{ eV} \qquad \text{(Numerical Formula 1)}$$

$$0 < IP2-Ip1 \leq 0.8 \text{ eV} \qquad \text{(Numerical Formula 1A)}$$

When the numerical formula (Numerical Formula 1) is satisfied, a phenomenon (herein, also referred to as trap emission) in which holes entering the emitting layer are captured by the fluorescent second compound to emit light can be inhibited. When the trap emission is inhibited, a recombination of holes and electrons is promoted in the first compound that is the delayed fluorescent compound. Energy transfer quickly occurs from the first compound in the excited state to the second compound, whereby the first compound is returned to the ground state and the second compound is brought into the excited state. When the second compound in the excited state is returned to the ground state, the second compound emits light. As described above, it is deduced that, since the recombination of holes and electrons in the first compound is promoted, excitons for contributing to emission from the second compound are increased, resulting in an improvement in the luminous efficiency.

Further, since the trap emission by the second compound is inhibited, carriers (holes and electrons) are inhibited from colliding against excitons (singlet excitons and triplet excitons). As a result, it is deduced that, although the number of the carriers in the emitting layer is increased in the high current density region as compared with in the low current density region, a roll-off in the high current density region is also inhibited because the organic EL device of the exemplary embodiment can inhibit the carriers and the excitons from colliding to be deactivated.

In the exemplary embodiment, Ip1 and Ip2 preferably satisfy a numerical formula below (Numerical Formula 2). When the numerical formula (Numerical Formula 2) is satisfied, the trap emission is easily inhibitable.

$$0 \leq Ip2-Ip1 \leq 0.5 \text{ eV} \qquad \text{(Numerical Formula 2)}$$

It should be noted that, at Ip2-Ip1>0.8 eV, the electrons are captured by the second compound to promote collision between the electrons and the excitons, thereby promoting the roll-off. In the exemplary embodiment, Ip1 and Ip2 more preferably satisfy a numerical formula (Numerical Formula 2A).

$$0 < Ip2-Ip1 \leq 0.5 \text{ eV} \qquad \text{(Numerical Formula 2A)}$$

In the exemplary embodiment, since magnitude of the emission quantum efficiency of the first compound contributes to an energy transfer efficiency, it is preferable that the emission quantum efficiency of the first compound is not excessively small, and is preferably 30% or more. On the other hand, when the emission quantum efficiency of the first compound exceeds 70%, the excited energy transfers to the second compound and the emission process from the first compound are likely to compete with each other. Accordingly, the emission quantum efficiency of the first compound is preferably 70% or less.

The organic EL device in the exemplary embodiment preferably emits light exhibiting a peak in a wavelength range of 550 nm or less. In other words, the main peak wavelength of the light emitted from the organic EL device preferably falls within a range of 550 nm or less. When the organic EL device in the exemplary embodiment emits light, it is preferable that the second compound mainly emits light in the emitting layer 5. The wavelength range of the light emitted by the organic EL device in the exemplary embodiment is more preferably from 430 nm to 550 nm.

Moreover, it is also preferable that the organic EL device in the exemplary embodiment emits blue or green fluorescence.

TADF Mechanism

In the organic EL device of the exemplary embodiment, the first compound is preferably a compound having a small $\Delta ST(M1)$ so that inverse intersystem crossing from the triplet energy level of the first compound to the singlet energy level thereof is easily caused by a heat energy given from the outside. An energy state conversion mechanism to perform spin exchange from the triplet state of electrically excited excitons within the organic EL device to the singlet state by inverse intersystem crossing is referred to as a TADF mechanism.

Figure 4:
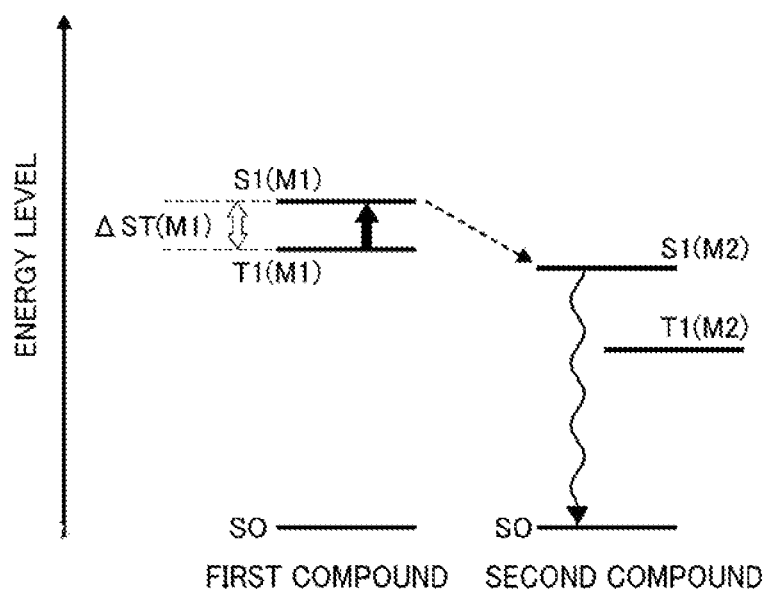
FIG. 4 shows a relationship in energy levels between compounds contained in an emitting layer and a relationship in energy transfer between the compounds in the first exemplary embodiment.

FIG. 4 exemplarily shows a relationship in energy levels between the first compound and the second compound in the emitting layer. In FIG. 4, S0 represents a ground state, S1(M1) represents a lowest singlet state of the first compound, T1(M1) represents a lowest triplet state of the first compound. S1(M2) represents a lowest singlet state of the second compound, and T1(M2) represents a lowest triplet state of the second compound. A dashed arrow directed from S1(M1) to S1(M2) in FIG. 4 represents Förster energy transfer from the lowest singlet state of the first compound to the lowest singlet suite of the second compound. A difference between the lowest singlet state S1 and the lowest triplet state T1 is defined as $\Delta ST$.

As shown in FIG. 4, when a compound having a small $\Delta ST(M1)$ is used as the first compound, inverse intersystem crossing from the lowest triplet state T1(M1) to the lowest singlet state S1(M1) can be caused by a heat energy. Accordingly, Förster energy transfer from the lowest singlet state S1(M1) of the first compound to the lowest singlet state S1(M2) of the second compound is caused. As a result, fluorescence from the lowest singlet state S1(M2) of the second compound can be observed. It is considered that the internal quantum efficiency can be theoretically raised up to 100% also by using delayed fluorescence by the TADF mechanism.

In the exemplary embodiment, a singlet energy S(M2) of the first compound is preferably larger than a singlet energy S(M2) of the second compound.

In the exemplary embodiment, an energy gap $T_{77K}(M1)$ at 77 [K] of the first compound is preferably larger than an energy gap $T_{77K}(M2)$ at 77 [K] of the second compound. $T_{77K}(M1)$ is preferably 2.0 eV or more, more preferably 2.2 eV or more.

Relationship Between Triplet Energy and Energy Gap at 77 [K]

Description will be made on a relationship between a triplet energy and an energy gap at 77 [K]. In the exemplary embodiment, the energy gap at 77 [K] is different from a typical triplet energy in some aspects.

The triplet energy is measured as follows. Firstly, a target compound for measurement is deposited on a quartz substrate to prepare a sample. Alternatively, the target compound is dissolved in an appropriate solvent to prepare a solution and the solution is encapsulated in a quartz glass pipe to prepare a sample. A phosphorescent spectrum (ordinate axis: phosphorescent luminous intensity, abscissa axis: wavelength) of the sample is measured at a low temperature (77 K). A tangent is drawn to the rise of the phosphorescent spectrum on the short-wavelength side. The triplet energy is calculated by a predetermined conversion equation based on a wavelength value at an intersection of the tangent and the abscissa axis.

The first compound usable in the exemplary embodiment is preferably a compound having a small $\Delta ST$. When $\Delta ST$ is small, intersystem crossing and inverse intersystem crossing are likely to occur even at a low temperature (77 K), so that the singlet state and the triplet state coexist. As a result, the spectrum to be measured in the same manner as the above includes emission from both the singlet state and the triplet state. Although it is difficult to distinguish the emission from the singlet state from the emission from the triplet state, the value of the triplet energy is basically considered dominant.

Accordingly, in the exemplary embodiment, the triplet energy is measured by the same method as a typical triplet energy T, but a value measured in the following manner is referred to as an energy gap $T_{77K}$ in order to differentiate the measured energy from the typical triplet energy in a strict meaning. In the measurement using a thin film, the target compound for the measurement is deposited at a film thickness of 100 nm on a quartz substrate to form a sample. A phosphorescent spectrum (ordinate axis: phosphorescent luminous intensity, abscissa axis: wavelength) of the sample is measured at a low temperature (77 K). A tangent is drawn to the rise of the phosphorescent spectrum on the short-wavelength side. An energy amount is calculated by the following conversion equation 1 based on a wavelength value $\lambda_{edge}$ [nm] at an intersection of the tangent and the abscissa axis and defined as an energy gap $T_{77K}$.

$$T_{77K} [eV] = 1239.85/\lambda_{dge} \quad \text{Conversion Equation 1:}$$

The tangent to the rise of the phosphorescence spectrum on the short-wavelength side is drawn as follow s. While moving on a curve of the phosphorescence spectrum from the short-wavelength side to the maximum spectral value closest to the short-wavelength side among the maximum spectral values, a tangent is checked at each point on the curve toward the long-wavelength of the phosphorescence spectrum. An inclination of the tangent is increased as the curve rises (i.e., a value of the ordinate axis is increased). A tangent drawn at a point of the maximum inclination (i.e., a tangent at an inflection point) was defined as the tangent to the rise of the phosphorescence spectrum on the short-wavelength side.

The maximum with peak intensity being 15% or less of the maximum peak intensity of the spectrum is not included in the above-mentioned maximum closest to the short-wavelength side of the spectrum. The tangent drawn at a point of the maximum spectral value being closest to the short-wavelength side and having the maximum inclination is defined as a tangent to the rise of the phosphorescence spectrum on the short-wavelength side.

For phosphorescence measurement, a spectrophotofluorometer body F-4500 (manufactured by Hitachi High-Technologies Corporation) is usable. The measurement instrument is not limited to this arrangement. A combination of a cooling unit, a low temperature container, an excitation light source and a light-receiving unit may be used for measurement.

Singlet Energy S

The singlet energy S is measured as follows.

10 μmol/L of a toluene solution containing the target compound for the measurement was prepared and put in a quartz cell to prepare a sample. An absorption spectrum (ordinate axis: luminous intensity, abscissa axis: wavelength) of the sample was measured at a normal temperature (300 K). A tangent was drawn to the fall of the absorption spectrum on the long-wavelength side, and a wavelength value $\lambda_{edge}$ [nm] at an intersection of the tangent and the abscissa axis was substituted in the following conversion equation to calculate a singlet energy.

$$S [eV] = 1239.85/\lambda_{edge} \quad \text{Conversion Equation 2:}$$

In Example, the absorption spectrum was measured using a spectrophotometer manufactured by Hitachi, Ltd. (device name: U3310). It should be noted that the absorption spectrum measuring device may be different from the above device.

The tangent to the fall of the absorption spectrum on the long-wavelength side is drawn as follows. While moving on a curve of the absorption spectrum from the maximum spectral value closest to the long-wavelength side in a long-wavelength direction, a tangent at each point on the curve is checked. An inclination of the tangent is decreased and increased in a repeated manner as the curve falls (i.e., a value of the ordinate axis is decreased). A tangent drawn at a point of the minimum inclination closest to the long-wavelength side (except when absorbance is 0.1 or less) is defined as the tangent to the fall of the absorption spectrum on the long-wavelength side.

The maximum absorbance of 0.2 or less is not included in the above-mentioned maximum absorbance on the long-wavelength side.

Film Thickness of Emitting Layer

A film thickness of the emitting layer 5 of the organic EL device 1 of the exemplary embodiment is preferably in a range from 5 nm to 100 nm, more preferably in a range from 7 nm to 100 nm, and most preferably in a range from 10 nm to 100 nm. The thickness of less than 5 nm may cause difficulty in forming the emitting layer 5 and in controlling chromaticity, while the thickness of more than 100 nm may raise drive voltage.

Content Ratio of Compounds in Emitting Layer

In the emitting layer 5 of the organic EL device 1 according to the exemplary embodiment, a content ratio of the first compound is preferably 5 mass % or more, more preferably in a range from 10 mass % to 80 mass %, further preferably in a range from 40 mass % to 60 mass %. A content ratio of the second compound is preferably in a range from 1 mass % to 10 mass %. An upper limit of the total of the respective content ratios of the first and second compounds in the emitting layer 5 is 100 mass %. It should be noted that the emitting layer 5 of the exemplary embodiment may further contain another material in addition to the first and second compounds.

Substrate

A substrate 2 is used as a support for the organic EL device 1. For instance, glass, quartz, plastics and the like are usable as the substrate 2. A flexible substrate is also usable. The flexible substrate is a bendable substrate. The flexible substrate is exemplified by a plastic substrate formed of polycarbonate, polyarylate, polyethersulfone, polypropylene, polyester, polyvinyl fluoride, polyvinyl chloride, polyimide, polyethylene naphthalate or the like. Moreover, an inorganic vapor deposition film is also usable as the substrate 2.

Anode

Metal, alloy, an electrically conductive compound, a mixture thereof and the like, which have a large work function (specifically, of 4.0 eV or more) is preferably usable as the anode 3 formed on the substrate 2. Specific examples of the material for the anode include indium tin oxide (ITO), indium tin oxide containing silicon or silicon oxide, indium zinc oxide, tungsten oxide, indium oxide containing zinc oxide and graphene. In addition, gold (Au), platinum (Pt), nickel (Ni), tungsten (W), chrome (Cr), molybdenum (Mo), iron (Fe), cobalt (Co), copper (Cu), palladium (Pd), titanium (Ti), or nitrides of a metal material (e.g., titanium nitride) are usable.

The above materials are typically deposited as a film by sputtering. For instance, indium zinc oxide can be deposited as a film by sputtering using a target that is obtained by adding zinc oxide in a range from 1 mass % to 10 mass % to indium oxide. Moreover, for instance, indium oxide containing tungsten oxide and zinc oxide can be deposited as a film by sputtering using a target that is obtained by adding tungsten oxide in a range from 0.5 mass % to 5 mass % and zinc oxide in a range from 0.1 mass % to 1 mass % to indium oxide. In addition, vapor deposition, coating, ink jet printing, spin coating and the like may be used for forming the anode 3.

Among the organic layers formed on the anode 3, a hole injecting layer 6 formed adjacent to the anode 3 is formed of a composite material that facilitates injection of holes irrespective of the work function of the anode 3. Accordingly, a material usable as an electrode material (e.g., metal, alloy, an electrically conductive compound, a mixture thereof, and elements belonging to Groups 1 and 2 of the periodic table of the elements) is usable as the material for the anode 3.

The elements belonging to Groups 1 and 2 of the periodic table of the elements, which are materials having a small work function, namely, an alkali metal such as lithium (Li) and cesium (Cs) and an alkaline earth metal such as magnesium (Mg), calcium (Ca) and strontium (Sr), alloy thereof (e.g., MgAg, AlLi), a rare earth metal such as europium (Eu) and ytterbium (Yb), and alloy thereof are also usable as the material for the anode. When the anode 3 is formed of the alkali metal, alkaline earth metal and alloy thereof, vapor deposition and sputtering are usable. Further, when the anode 3 is formed of silver paste and the like, coating, ink jet printing and the like are usable.

Hole Injecting Layer

A hole injecting layer 6 is a layer containing a highly hole-injectable substance. Examples of the highly hole-injectable substance include molybdenum oxide, titanium oxide, vanadium oxide, rhenium oxide, ruthenium oxide, chromium oxide, zirconium oxide, hafnium oxide, tantalum oxide, silver oxide, tungsten oxide, and manganese oxide.

In addition, the examples of the highly hole-injectable substance further include: an aromatic amine compound, which is a low-molecule compound, such that 4,4',4"-tris (N,N-diphenylamino)tripbenylamine (abbreviation: TDATA), 4,4',4"-tris[N-(3-methylphenyl)-N-phenylamino] triphenylamine (abbreviation: MTDATA), 4,4'-bis[N-(4-diphenylaminophenyl)-N-phenylamino]biphenyl(abbreviation: DPAB), 4,4'-bis(N-{4-[N"-(3-methylphenyl)-N'-phenylamino]phenyl}-N-phenylamino)biphenyl (abbreviation: DNTPD), 1,3,5-tris[N-(4-diphenylaminophenyl)-N-phenylamino]benzene (abbreviation: DPA3B), 3-[N-(9-phenylcarbazole-3-yl)-N-phenylamino]-9-phenylcarbazole (abbreviation: PCzPCA1), 3,6-bis[N-(9-phenylcarbazole-3-yl)-N-phenylamino]-9-phenylcarbazole (abbreviation: PCzPCA2), and 3-[N-(1-naphthyl)-N-(9-phenylcarbazole-3-yl)amino]-9-phenylcarbazole (abbreviation: PCzPCN1); and dipyrazino[2,3-f:20,30-h]quinoxaline-2,3, 6,7,10,11-hexacarbonitrile (HAT-CN).

Moreover, a high-molecule compound (e.g., an oligomer, dendrimer and polymer) is also usable as the highly hole-injectable substance. Examples of the high-molecule compound include poly(N-vinylcarbazole) (abbreviation: PVK), poly(4-vinyltriphenylamine) (abbreviation: PVTPA), poly [N-(4-{N'-[4-(4-diphenylamino)phenyl]phenyl-N'-phenylamino}phenyl)methacrylamido] (abbreviation: PTP-DMA), and poly[N,N'-bis(4-butylphenyl)-N,N'-bis(phenyl) benzidine] (abbreviation: Poly-TPD). Furthermore, the examples of the high-molecule compound include a high-molecule compound added with an acid such as poly(3,4-ethylene dioxythiophene)/poly(styrene sulfonic acid) (PEDOT/PSS), and polyaniline/poly(styrene sulfonic acid) (PAni/PSS).

Hole Transporting Layer

A hole transporting layer 7 is a layer containing a highly hole-transportable substance. An aromatic amine compound, carbazole derivative, anthracene derivative and the like are usable for the hole transporting layer 7. Specific examples of a material for the hole transporting layer 7 include 4,4'-bis [N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4-phenyl-4'-(9-phenylfluorene-9-yl)triphenylamine (abbreviation; BAFLP), 4,4'-bis[N-(9,9-dimethylfluorene-2-yl)-N-phenylamino]biphenyl (abbreviation: DFLDPBi), 4,4',4"-tris (N,N'-diphenylamino)triphenylamine (abbreviation: TDATA), 4,4',4"-tris[N-(3-methylphenyl)-N-phenylamino] triphenylamine (abbreviation: MTDATA), and 4,4'-bis[N-(spiro-9,9'-bifluorene-2-yl)-N-phenylamino]biphenyl (abbreviation: BSPB). The above-described substances mostly have a hole mobility of $10^{-6}$ $cm^2/(V \cdot s)$ or more.

A carbazole derivative such as CBP, 9-[4-(N-carbazolyl)] phenyl-10-phenyl anthracene (CzPA) and 9-phenyl-3-[4-(10-phenyl-9-anthryl)phenyl]-9H-carbazole (PC/PA): an anthracene derivative such as t-BuDNA, DNA, and DPAnth; and a high-molecular weight compound such as poly(N-vinylcarbazole)(abbreviation: PVK) and poly(4-vinyltriphenylamine)(abbreviation: PVTPA) are usable for the hole transporting layer 7.

However, any substance having a hole transporting performance higher than an electron transporting performance may be used in addition to the above substances. A highly hole-transportable substance may be provided in the form of a single layer or a laminated layer of two or more layers of the above substance.

When the hole transporting layer includes two or more layers, one of the layers with a larger energy gap is preferably provided closer to the emitting layer 5.

In the exemplary embodiment, the hole transporting layer 7 preferably has a function of preventing triplet excitons generated in the emitting layer 5 from diffusing into the hole transporting layer to trap the triplet excitons within the emitting layer 5.

Electron Transporting Layer

An electron transporting layer 8 is a layer containing a highly electron-transportable substance. As the electron transporting layer, 1) a metal complex such as an aluminum complex, beryllium complex and zinc complex, 2) heteroaromatic compound such as an imidazole derivative, benzimidazole derivative, azine derivative, carbazole derivative, and phenanthroline derivative, and 3) a high-molecule compound are usable. Specifically, as a low-molecule organic compound, a metal complex such as Alq, tris(4-methyl-8-quinolinato)aluminum (abbreviation: Almq3), bis(10-hydroxybenzo[h]quinolinato)beryllium (abbreviation: BeBq2), BAlq, Znq, ZnPBO and ZnBTZ are usable. In addition to the metal complex, a heteroaromatic compound such as 2-(4-biphenyl)-5-(4-tert-butylphenyl)-1,3,4-oxadiazole (abbreviation: PBD), 1,3-bis[5-(ptert-butylphenyl)-1,3,4-oxadiazole-2-yl]benzene (abbreviation: OXD-7), 3-(4-tert-butylphenyl)-4-phenyl-5-(4-biphenyl)-1,2,4-triazole (abbreviation: TAZ), 3-(4-tert-butylphenyl)-4-(4-ethylphenyl)-5-(4-biphenyl)-1,2,4-triazole (abbreviation: p-EtTAZ), bathophenanthroline (abbreviation: BPhen), bathocuproine (abbreviation: BCP), and 4,4'-bis(5-methylbenzoxazole-2-yl)stilbene (abbreviation: BzOs) are usable. In the exemplary embodiment, a benzimidazole compound is suitably usable. The above-described substances mostly have an electron mobility of $10^{-6}$ cm$^2$/(V·s) or more. However, any substance having an electron transporting performance higher than a hole transporting performance may be used for the electron transporting layer 8 in addition to the above substances. The electron transporting layer 8 may be provided in the form of a single layer or a laminated layer of two or more layers of the above substance(s).

Moreover, a high-molecule compound is also usable for the electron transporting layer 8. For instance, poly[(9,9-dihexylfluorene-2,7-diyl)-co-(pyridine-3,5-diyl)](abbreviation: PF-Py), poly[(9,9-dioctylfluorene-2,7-diyl)-co-(2,2'-bipyridine-6,6'-diyl)](abbreviation: PF-BPy) and the like are usable.

In the exemplary embodiment, the hole transporting layer 8 preferably has a function of preventing triplet excitons generated in the emitting layer 5 from diffusing into the hole transporting layer 8 and the electron injecting layer 9 to trap the triplet excitons within the emitting layer 5.

Electron Injecting Layer

An electron injecting layer 9 is a layer containing a highly electron-injectable substance. Examples of a material for the electron injecting layer include an alkali metal, alkaline earth metal and a compound thereof, examples of which include lithium (Li), cesium (Cs), calcium (Ca), lithium fluoride (LiF), cesium fluoride (CsF), calcium fluoride (CaF2), and lithium oxide (LiOx). In addition, a substance obtained by containing an alkali metal, alkaline earth metal or a compound thereof in the election transportable substance, specifically, for instance, a substance obtained by containing magnesium (Mg) in Alq may be used. With this substance, electrons can be more efficiently injected from the cathode 4.

Alternatively, a composite material provided by mixing an organic compound with an electron donor may be used for the electron injecting layer 9. The composite material exhibits excellent electron injecting performance and electron transporting performance since the electron donor generates electron in the organic compound. In this arrangement, the organic compound is preferably a material exhibiting an excellent transforming performance of the generated electrons. Specifically, for instance, the above-described substance for the electron transporting layer 8 (e.g., the metal complex and heteroaromatic compound) is usable. The electron donor may be any substance exhibiting an electron donating performance to the organic compound. Specifically, an alkali metal, alkaline earth metal and a rare earth metal are preferable, examples of which include lithium, cesium, magnesium, calcium, erbium and ytterbium. Moreover, an alkali metal oxide and alkaline earth metal oxide are preferable, examples of which include lithium oxide, calcium oxide, and barium oxide. Further, Lewis base such as magnesium oxide is also usable. Furthermore, tetrathiafulvalene (abbreviation: TTF) is also usable.

Cathode

Metal, alloy, an electrically conductive compound, a mixture thereof and the like, which have a small work function, specifically, of 3.8 eV or less, is preferably usable as a material for the cathode 4. Specific examples of the material for the cathode 4 include: the elements belonging to Groups 1 and 2 of the periodic table of the elements, namely, an alkali metal such as lithium (Li) and cesium (Cs) and an alkaline earth metal such as magnesium (Mg), calcium (Ca) and strontium (Sr); alloy thereof (e.g., MgAg, AlLi); a rare earth metal such as europium (Eu) and ytterbium (Yb); and alloy thereof.

When the cathode 4 is formed of the alkali metal, alkaline earth metal and alloy thereof, vapor deposition and sputtering are usable. Moreover, when the cathode 4 is formed of silver paste and the like, coating, inkjet printing and the like are usable.

By providing the electron injecting layer 9, various conductive materials such as Al, Ag, ITO, graphene and indium tin oxide containing silicon or silicon oxide are usable for forming the cathode 4 irrespective of the magnitude of the work function. The conductive materials can be deposited as a film by sputtering, ink jet printing, spin coating and the like.

Layer Formation Method(s)

There is no restriction except for the above particular description for a method for forming each layer of the organic EL device 1 in the exemplary embodiment. Known methods such as dry film-forming and wet film-forming are applicable. Examples of the dry film-forming include vacuum deposition, sputtering, plasma and ion plating. Examples of the wet film-forming include spin coating, dipping, flow coating and ink-jet printing.

Film Thickness

There is no restriction except for the above particular description for a film thickness of each of the organic layers of the organic EL device 1 in the exemplary embodiment. The film thickness is typically preferably in a range of several nanometers to 1 µm because an excessively-thinned film is likely to cause defects such as a pin hole while an excessively-thickened film requires high voltage to be applied and deteriorates efficiency.

Herein, the number of carbon atoms forming a ring (also referred to as ring carbon atoms) means the number of carbon atoms included in atoms forming the ring itself of a compound in which the atoms are bonded to form the ring (e.g., a monocyclic compound, a fused ring compound, a cross-linked compound, a carbocyclic compound, and a heterocyclic compound). When the ring is substituted by a substituent, the "ring carbon atoms" do not include carbon(s) contained in the substituent. Unless specifically described, the same applies to the "ring carbon atoms"

described later. For instance, a benzene ring has 6 ring carbon atoms, a naphthalene ring has 10 ring carbon atoms, a pyridinyl group has 5 ring carbon atoms, and a furanyl group has 4 ring carbon atoms. When the benzene ring and/or the naphthalene ring is substituted by, for instance, an alkyl group, the number of carbon atoms of the alkyl group is not included in the number of the ring carbon atoms. When a fluorene ring is substituted by, for instance, a fluorene ring (e.g., a spirofluorene ring), the number of carbon atoms of the fluorene ring as a substituent is not counted in the number of the ring carbon atoms for the fluorene ring.

Herein, the number of atoms forming a ring (also referred to as ring atoms) means the number of atoms forming the ring itself of a compound in which the atoms are bonded to form the ring (e.g., a monocyclic compound, a fused ring compound, a cross-linked compound, a carbocyclic compound, and a heterocyclic compound). Atom(s) not forming the ring (e.g., a hydrogen atom for terminating the atoms forming the ring) and atoms included in a substituent substituting the ring are not counted in the number of the ring atoms. Unless specifically described, the same applies to the "ring atoms" described later. For instance, a pyridine ring has 6 ring atoms, a quinazoline ring has 10 ring atoms, and a furan ring has 5 ring atoms. Hydrogen atoms respectively bonded to the pyridine ring and the quinazoline ring and atoms forming the substituents are not counted in the number of the ring atoms. When a fluorene ring is substituted by, for instance, a fluorene ring (e.g., a spirofluorene ring), the number of atoms of the fluorene ring as a substituent is not included in the number of the ring atoms for the fluorene ring.

Next, each of substituents described in the above formulae will be described.

Examples of the aromatic hydrocarbon group (occasionally referred to as an aryl group) having 6 to 30 ring carbon atoms or 6 to 40 ring carbon atoms herein include a phenyl group, biphenyl group, terphenyl group, naphthyl group, anthryl group, phenanthryl group, fluorenyl group, pyrenyl group, chrysenyl group, fluoranthenyl group, benz[a]anthryl group, benzo[c]phenanthryl group, triphenylenyl group, benzo[k]fluoranthenyl group, benzo[g]chrysenyl group, benzo[b]triphenylenyl group, picenyl group, and perylenyl group.

The aryl group herein preferably has 6 to 20 ring carbon atoms, more preferably 6 to 14 ring carbon atoms, further preferably 6 to 12 ring carbon atoms. Among the aryl group, a phenyl group, biphenyl group, naphthyl group, phenanthryl group, terphenyl group and fluorenyl group are particularly preferable. A carbon atom at a position 9 of each of 1-fluorenyl group, 2-fluorenyl group, 3-fluorenyl group and 4-fluorenyl group is preferably substituted by a substituted or unsubstituted alkyl group having 1 to 30 carbon atoms or a substituted or unsubstituted aryl group having 6 to 18 ring carbon atoms later described herein.

The heterocyclic group (occasionally, referred to as heteroaryl group, heteroaromatic ring group or aromatic heterocyclic group) having 5 to 30 ring atoms herein preferably contains at least one atom selected from the group consisting of nitrogen, sulfur, oxygen, silicon, selenium atom and germanium atom, and more preferably contains at least one atom selected from the group consisting of nitrogen, sulfur and oxygen.

Examples of the heterocyclic group (occasionally, referred to as heteroaryl group, heteroaromatic ring group or aromatic heterocyclic group) having 5 to 30 ring atoms herein include a pyridyl group, pyrimidinyl group, pyrazinyl group, pyridazynyl group, triazinyl group, quinolyl group, isoquinolinyl group, naphthyridinyl group, phthalazinyl group, quinoxalinyl group, quinazolinyl group, phenanthridinyl group, acridinyl group, phenanthrolinyl group, pyrrolyl group, imidazolyl group, pyrazolyl group, triazolyl group, tetrazolyl group, indolyl group, benzimidazolyl group, indazolyl group, imidazopyridinyl group, benzotriazolyl group, carbazolyl group, furyl group, thienyl group, oxazolyl group, thiazolyl group, isoxazolyl group, isothiazolyl group, oxadiazolyl group, thiadiazolyl group, benzofuranyl group, benzothiophenyl group, benzoxazolyl group, benzothiazolyl group, benzisoxazolyl group, benzisothiazolyl group, benzoxadiazolyl group, benzothiadiazolyl group, dibenzofuranyl group, dibenzothiophenyl group, piperidinyl group, pyrrolidinyl group, piperazinyl group, morpholyl group, phenazinyl group, phenothiazinyl group, and phenoxazinyl group.

The heterocyclic group herein preferably has 5 to 20 ring atoms, more preferably 5 to 14 ring atoms. Among the above, a 1-dibenzofuranyl group, 2-dibenzofuranyl group, 3-dibenzofuranyl group, 4-dibenzofuranyl group, 1-dibenzothiophenyl group, 2-dibenzothiophenyl group, 3-dibenzothiophenyl group, 4-dibenzothiophenyl group, 1-carbazolyl group, 2-carbazolyl group, 3-carbazolyl group, 4-carbazolyl group, and 9-carbazolyl group are particularly preferable. A nitrogen atom at a position 9 of each of 1-carbazolyl group, 2-carbazolyl group, 3-carbazolyl group and 4-carbazolyl group is preferably substituted by a substituted or unsubstituted aryl group having 6 to 30 ring carbon atoms or a substituted or unsubstituted heterocyclic group having 5 to 30 ring atoms herein.

Herein, the heterocyclic group may be a group derived from any one of partial structures represented by formulae (XY-1) to (XY-18).

[Formula 16]

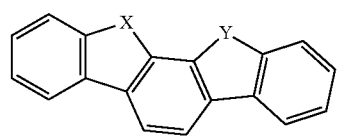

(XY-1)

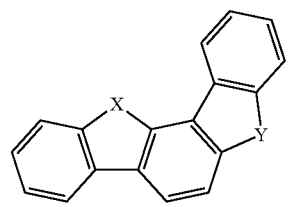

(XY-2)

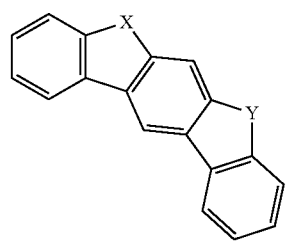

(XY-3)

-continued (XY-4)
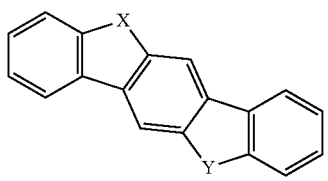

(XY-5)
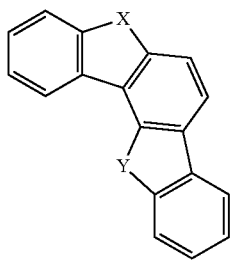

(XY-6)
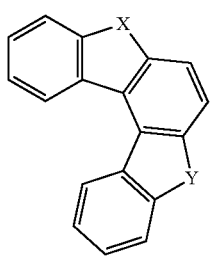

[Formula 17]

(XY-7)
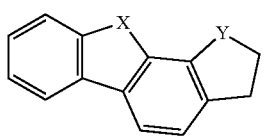

(XY-8)
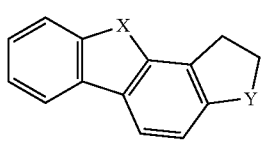

(XY-9)
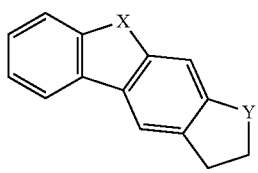

(XY-10)
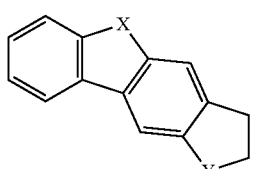

(XY-11)
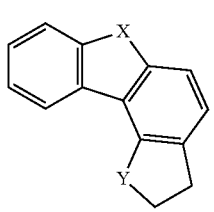

(XY-12)
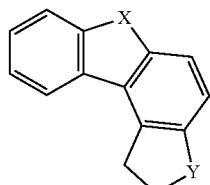

[Formula 18]

(XY-13)
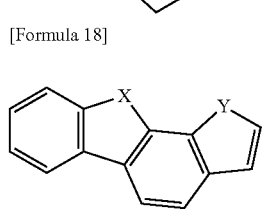

(XY-14)
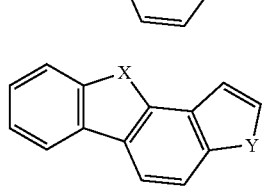

(XY-15)
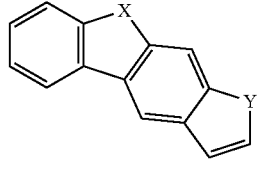

(XY-16)
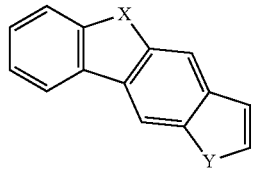

(XY-17)
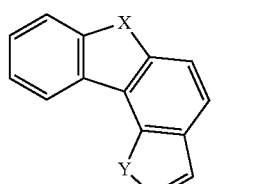

(XY-18)
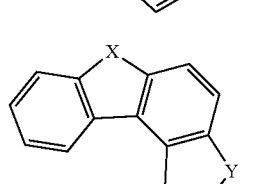

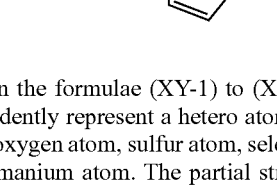

In the formulae (XY-1) to (XY-18). X and Y each independently represent a hetero atom, and preferably represent an oxygen atom, sulfur atom, selenium atom, silicon atom or germanium atom. The partial structures represented by the formulae (XY-1) to (XY-18) may each be bonded in any position to be a heterocyclic group, which may be substituted.

Herein, examples of the substituted or unsubstituted carbazolyl group may include a group in which a carbazole ring is further fused with a ring(s) as shown in the following formulae. Such a group may be substituted. The group may be bonded in any position as desired.

[Formula 19]

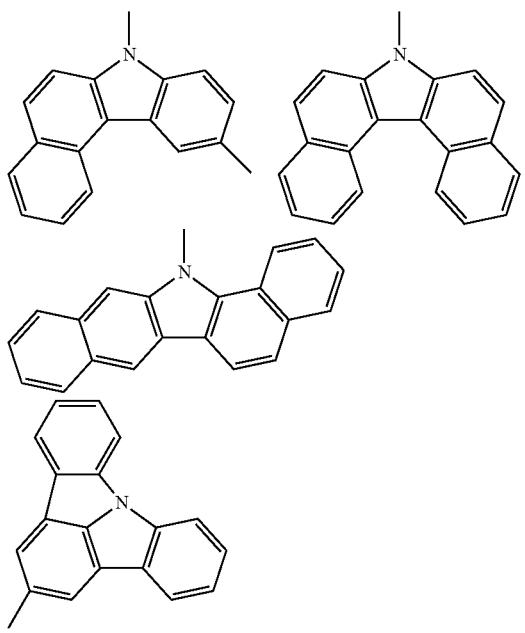

The alkyl group having 1 to 30 carbon atoms herein may be linear, branched or cyclic. Examples of the linear or branched alkyl group are a methyl group, ethyl group, propyl group, isopropyl group, n-butyl group, s-butyl group, isobutyl group, t-butyl group, n-pentyl group, n-hexyl group, n-heptyl group, n-octyl group, n-nonyl group, n-decyl group, n-undecyl group, n-dodecyl group, n-tridecyl group, n-tetradecyl group, n-pentadecyl group, n-hexadecyl group, n-heptadecyl group, n-octadecyl group, neo-pentyl group, amyl group, isoamyl group, 1-methylpentyl group, 2-methylpentyl group, 1-pentylhexyl group, 1-butylpentyl group, 1-heptyloctyl group and 3-methylpentyl group.

The linear or branched alkyl group herein preferably has 1 to 10 carbon atoms, more preferably 1 to 6 carbon atoms. Among the linear or branched alkyl group, a methyl group, ethyl group, propyl group, isopropyl group, n-butyl group, s-butyl group, isobutyl group, t-butyl group, n-pentyl group, n-hexyl group, amyl group, isoamyl group and neopentyl group are particularly preferable.

Examples of the cycloalkyl group having 3 to 30 carbon atoms herein are a cyclopropyl group, cyclobutyl group, cyclopentyl group, cyclohexyl group. 4-methylcyclohexyl group, adamantyl group and norbornyl group. The cycloalkyl group preferably has 3 to 10 ring carbon atoms, more preferably 5 to 8 ring carbon atoms. Among the cycloalkyl group, a cyclopentyl group and a cyclohexyl group are particularly preferable.

A halogenated alkyl group provided by substituting an alkyl group with a halogen atom is exemplified by one provided by substituting an alkyl group having 1 to 30 carbon atoms with one or more halogen groups. Specific examples of the above halogenated alkyl group are a fluoromethyl group, difluoromethyl group, trifluoromethyl group, fluoroethyl group, trifluoromethylmethyl group, trifluoroethyl group and pentafluoroethyl group.

Herein, "carbon atoms forming a ring (ring carbon atoms)" mean carbon atoms forming a saturated ring, unsaturated ring, or aromatic ring. "Atoms forming a ring (ring atoms)" mean carbon atoms and hetero atoms forming a hetero ring including a saturated ring, unsaturated ring, or aromatic ring.

Herein, a "hydrogen atom" means isotopes having different neutron numbers and specifically encompasses protium, deuterium and tritium.

Herein, in addition to the above-described aryl group, heterocyclic group, alkyl group (linear or branched alkyl group, cycloalkyl group and haloalkyl group), examples of the substituent meant by "substituted or unsubstituted" include an aralkyl group, substituted amino group, halogen atom, cyano group, alkoxy group, aryloxy group, alkylsilyl group, arylsilyl group, alkenyl group, alkynyl group, alkylthio group, arylthio group, hydroxyl group, nitro group, and carboxy group.

Among the above substituents, an aryl group, heterocyclic group, alkyl group, halogen atom, alkylsilyl group, arylsilyl group and cyano group are preferable. More preferable substituents are one listed as the preferable substituents described for each substituent.

The above substituents may be further substituted by at least one group selected from the group consisting of an aryl group, heterocyclic group, alkyl group, alkylsilyl group, arylsilyl group, alkoxy group, aryloxy group, alkylamino group, aryl amino group, alkylthio group, arylthio group, alkenyl group, alkynyl group, aralkyl group, halogen atom, cyano group, hydroxyl group, nitro group, and carboxy group. In addition, plural ones of these substituents may be mutually bonded to form a ring.

The alkoxy group having 1 to 30 carbon atoms is represented by —$OZ_1$. $Z_1$ is exemplified by the above alkyl group having 1 to 30 carbon atoms. Examples of the alkoxy group are a methoxy group, ethoxy group, propoxy group, butoxy group, pentyloxy group and hexyloxy group. The alkoxy group preferably has 1 to 20 carbon atoms.

A halogenated alkoxy group provided by substituting an alkoxy group with a halogen atom is exemplified by one provided by substituting an alkoxy group having 1 to 30 carbon atoms with one or more halogen groups.

The aryloxy group having 6 to 30 ring carbon atoms is represented by —$OZ_2$. $Z_2$ is exemplified by the above aryl group having 6 to 30 ring carbon atoms. The aryloxy group preferably has 6 to 20 ring carbon atoms. The aryloxy group is exemplified by a phenoxy group.

Examples of the substituted amino group include an alkylamino group having 2 to 30 carbon atoms and an arylamino group having 6 to 60 ring carbon atoms. The alkylamino group having 2 to 30 carbon atoms is represented by —$NHR_V$ or —$N(R_V)$. $R_V$ is exemplified by the alkyl group having 1 to 30 carbon atoms.

The arylamino group having 6 to 60 ring carbon atoms is represented by —$NHR_W$ or —$N(R_W)_2$. $R_W$ is exemplified by the above aryl group having 6 to 30 ring carbon atoms.

Examples of the halogen atom include a fluorine atom, chlorine atom, bromine tom and iodine atom, among which a fluorine atom is preferable.

The aralkyl group is preferably an aralkyl group having 6 to 30 ring carbon atoms and is represented by —$Z_3$—$Z_4$. $Z_3$ is exemplified by an alkylene group corresponding to the above alkyl group having 1 to 30 carbon atoms. $Z_4$ is exemplified by the above aryl group having 6 to 30 ring carbon atoms. This aralkyl group is preferably an aralkyl group having 7 to 30 carbon atoms, in which an aryl moiety has 6 to 30 carbon atoms, preferably 6 to 20 carbon atoms, more preferably 6 to 12 carbon atoms and an alkyl moiety has 1 to 30 carbon atoms, preferably 1 to 20 carbon atoms, more preferably 1 to 10 carbon atoms, further preferably 1 to 6 carbon atoms. Examples of the aralkyl group include a benzyl group, 2-phenylpropane-2-yl group, 1-phenylethyl group, 2-phenylethyl group, 1-phenylisopropyl group, 2-phenyl isopropyl group, phenyl-t-butyl group, α-naphthylmethyl group, 1-α-naphthylethyl group, 2-α-naphthylethyl group, 1-α-naphthylisopropyl group, 2-α-naphthylisopropyl group, β-naphthylmethyl group, 1-β-naphthylethyl group, 2-β-naphthylethyl group, 1-β-naphthylisopropyl group, and 2-β-naphthylisopropyl group.

The alkenyl group is preferably an alkenyl group having 2 to 30 carbon atoms, which may be linear, branched or cyclic. Examples of the alkenyl group include a vinyl group, propenyl group, butenyl group, oleyl group, eicosapentaenyl group, docosahexaenyl group, styryl group, 2,2-diphenylvinyl group, 1,2,2-triphenylvinyl group, 2-phenyl-2-propenyl group, cyclopentadienyl group, cyclopentenyl group, cyclohexenyl group, and cyclohexadienyl group.

The alkynyl group is preferably an alkynyl group having 2 to 30 carbon atoms, which may be linear, branched or cyclic. Examples of the alkynyl group include ethynyl, propynyl, and 2-phenylethynyl.

The alkylthio group having 1 to 30 carbon atoms is represented by —$SR_V$. $R_V$ is exemplified by the alkyl group having 1 to 30 carbon atoms. The alkylthio group preferably has 1 to 20 carbon atoms.

The arylthio group having 6 to 30 ring carbon atoms is represented by —$SR_W$. $R_W$ is exemplified by the above aryl group having 6 to 30 ring carbon atoms. The arylthio group preferably has 6 to 20 ring carbon atoms.

Examples of the substituted silyl group include an alkylsilyl group having 3 to 30 carbon atoms and an arylsilyl group having 6 to 30 ring carbon atoms.

The alkylsilyl group having 3 to 30 carbon atoms herein is exemplified by an alkylsilyl group having the alkyl group listed as the examples of the alkyl group having 1 to 30 carbon atoms. Specifically, examples of the alkylsilyl group are a trimethylsilyl group, a triethylsilyl group, a tri-n-butylsilyl group, a tri-n-octylsilyl group, a triisobutylsilyl group, a dimethylethylsilyl group, a dimethylisopropylsilyl group, a dimethyl-n-propylsilyl group, a dimethyl-n-butylsilyl group, a dimethyl-t-butylsilyl group, a diethylisopropylsilyl group, a vinyldimethylsilyl group, a propyldimethylsilyl group and triisopropylsilyl group. Three alkyl groups in the trialkylsilyl group may be the same or different.

Examples of the arylsilyl group having 6 to 30 ring carbon atoms are a dialkylarylsilyl group, alkyldiarylsilyl group and triarylsilyl group.

The dialkylarylsilyl group is exemplified by a dialkylarylsilyl group including two of the alkyl group listed as the examples of the alkyl group having 1 to 30 carbon atoms and one of the aryl group listed as the examples of the aryl group having 6 to 30 ring carbon atoms. The dialkylarylsilyl group preferably has 8 to 30 carbon atoms.

The alkyldiarylsilyl group is exemplified by an alkyldiarylsilyl group including one of the alkyl group listed as the examples of the alkyl group having 1 to 30 carbon atoms and two of the aryl group listed as the examples of the aryl group having 6 to 30 ring carbon atoms. The alkyldiarylsilyl group preferably has 13 to 30 carbon atoms.

The triarylsilyl group is exemplified by a triarylsilyl group including three of the aryl group listed as the examples of the aryl group having 6 to 30 ring carbon atoms. The triarylsilyl group preferably has 18 to 30 carbon atoms.

An aldehyde group, carbonyl group, ester group, carbamoyl group, and amino group may be substituted by an aliphatic hydrocarbon, alicyclic hydrocarbon, aromatic hydrocarbon, or heterocycle. The aliphatic hydrocarbon, alicyclic hydrocarbon, aromatic hydrocarbon, and heterocycle may further have a substituent. A siloxanyl group is a silicon compound group with an ether bond and is exemplified by a trimethylsiloxanyl group.

"Unsubstituted" in "substituted or unsubstituted" herein means that a group is not substituted by the above-described substituents but bonded with a hydrogen atom.

Herein, "XX to YY carbon atoms" in the description of "substituted or unsubstituted ZZ group having XX to YY carbon atoms" represent carbon atoms of an unsubstituted ZZ group and do not include carbon atoms of a substituent(s) of the substituted ZZ group. Herein, "YY" is larger than "XX." "XX" and "YY" each mean an integer of 1 or more.

Herein, "XX to YY atoms" in the description of "substituted or unsubstituted ZZ group having XX to YY atoms" represent atoms of an unsubstituted ZZ group and does not include atoms of a substituent(s) of the substituted ZZ group. Herein, "YY" is larger than "XX." "XX" and "YY" each mean an integer of 1 or more.

Herein, when the substituents are mutually bonded to form a ring structure, the ring structure is a saturated ring, unsaturated ring, aromatic hydrocarbon ring, or a heterocycle. In addition, the ring structure formed by bonding the substituents may have a substituent.

Herein, examples of the aromatic hydrocarbon group and the heterocyclic group in the linking group include divalent groups obtained by eliminating one hydrogen atom from the above monovalent groups.

Moreover, herein, examples of the aromatic hydrocarbon ring and the heterocycle include ring structures from which the above monovalent groups are derived.

Electronic Device

The organic EL device 1 according to the exemplary embodiment of the invention is usable in an electronic device such as a display unit and a light-emitting unit. Examples of the display unit include display components such as an organic EL panel module, TV, mobile phone, tablet, and personal computer. Examples of the light-emitting unit include an illuminator and a vehicle light.

Second Exemplary Embodiment

Arrangement(s) of an organic EL device according to a second exemplary embodiment will be described below. In the description of the second exemplary embodiment, the same components as those in the first exemplary embodiment are denoted by the same reference signs and names to simplify or omit an explanation of the components. In the second exemplary embodiment, the same materials and compounds as described in the first exemplary embodiment are usable for a material and a compound which are not particularly described.

The organic EL device according to the second exemplary embodiment is different from the organic EL device according to the first exemplary embodiment in that the emitting layer further includes a third compound. Other components are the same as those in the first exemplary embodiment.

Third Compound

A singlet energy of the third compound is larger than the singlet energy of the first compound.

Figure 5:
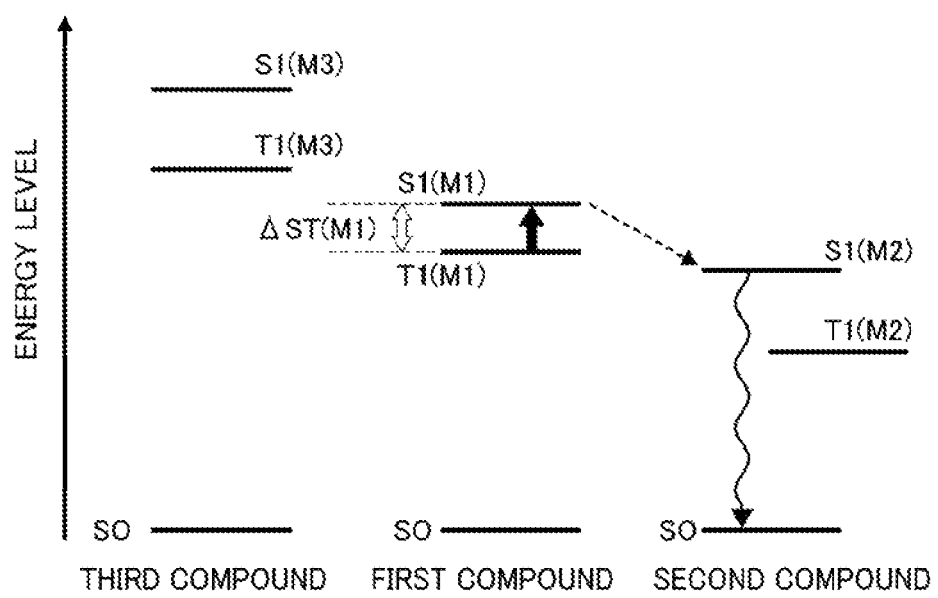
FIG. 5 shows a relationship in energy levels between compounds contained in an emitting layer and a relationship in energy transfer between the compounds in the second exemplary embodiment.

FIG. 5 exemplarily shows a relationship in energy levels between the first compound, the second compound and the third compound in the emitting layer. In FIG. 5, S0 represents a ground state, S1(M1) represents the lowest singlet state of the first compound, T1(M1) represents the lowest triplet state of the first compound, S1(M2) represents the lowest singlet state of the second compound, T1(M2) represents the lowest triplet state of the second compound, S1(M3) represents a lowest singlet state of the third compound, and T1(M3) represents a lowest triplet state of the third compound. A dashed arrow directed from S1(M1) to S1(M2) in FIG. 5 represents Förster energy transfer from the lowest singlet state of the first compound to the lowest singlet state of the second compound.

As shown in FIG. 5, when a compound having a small ΔST(M1) is used as the first compound, inverse intersystem crossing from the lowest triplet state T1(M1) to the lowest singlet state S1(M1) can be caused by a heat energy. Accordingly, Förster energy transfer from the lowest singlet state S1(M1) of the first compound to the lowest singlet state S1(M2) of the second compound is caused. As a result, fluorescence from the lowest singlet state S1(M2) of the second compound can be observed. It is considered that the internal quantum efficiency can be theoretically raised up to 100% also by using delayed fluorescence by the TADF mechanism.

Ratio of Three Components

In the emitting layer of the organic EL device of the exemplary embodiment, it is preferable that the content ratio of the first compound is in a range from 10 mass % to 80 mass %, the content ratio of the second compound is in a range from 1 mass % to 10 mass %, and the content ratio of the third compound is in a range from 10 mass % to 80 mass %. The content ratio of the first compound is more preferably in a range from 20 mass % to 80 mass %, further preferably in a range from 40 mass % to 60 mass %. An upper limit of the total of the respective content ratios of the first to third compounds in the emitting layer is 100 mass %. It should be noted that the emitting layer of the exemplary embodiment may further contain another material in addition to the first to third compounds.

Although the third compound is not particularly limited, the third compound is preferably a compound other than an amine compound. For instance, a carbazole derivative, dibenzofuran derivative and dibenzothiophene derivative are usable as the third compound. However, the third compound is not limited thereto.

The third compound preferably has at least one of a partial structure represented by a formula (31) below and a partial structure represented by a formula (32) below in one molecule.

[Formula 20]

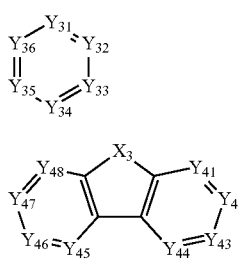

(31)

(32)

In the formula (31): $Y_{31}$ to $Y_{36}$ each independently represent a nitrogen atom or a carbon atom bonded to another atom in the molecule of the third compound.

However, at least one of $Y_{31}$ to $Y_{36}$ is a carbon atom bonded to another atom in the molecule of the third compound.

In the formula (32): $Y_{41}$ to $Y_{48}$ each independently represent a nitrogen atom or a carbon atom bonded to another atom in the molecule of the third compound.

However, at least one of $Y_{41}$ to $Y_{48}$ is a carbon atom bonded to another atom in the molecule of the third compound.

$X_3$ represents a nitrogen atom, an oxygen atom or a sulfur atom.

In the formula (32), it is also preferable that at least two of $Y_{41}$ to $Y_{48}$ are carbon atoms bonded to another atom in the molecule of the third compound and a ring structure is formed including the carbon atoms.

For instance, the partial structure represented by the formula (32) is preferably a partial structure selected from the group consisting of formulae (321), (322), (323), (324), (325) and (326) below.

[Formula 21]

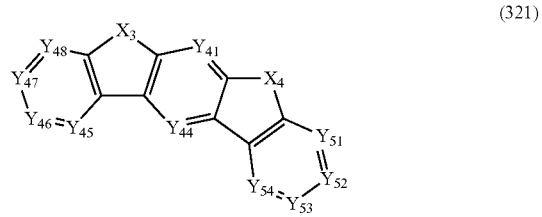

(321)

(322)

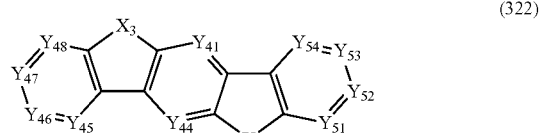

(323)

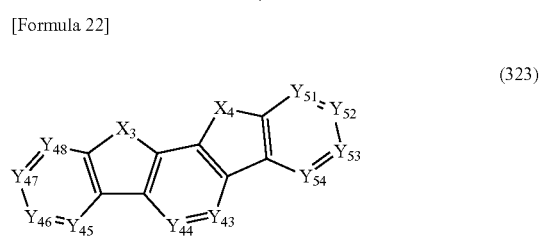

(324)

[Formula 22]

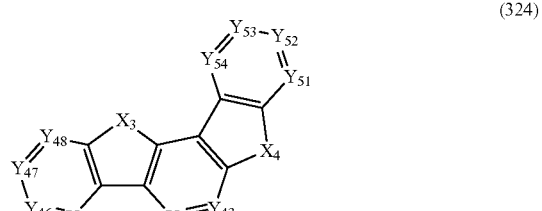

[Formula 23]

(325)

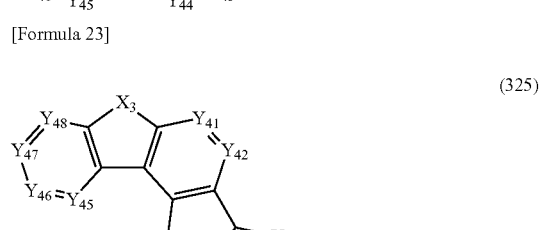

(326)

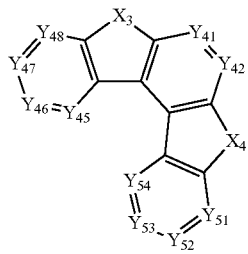

In the above formulae (321) to (326), $X_3$ represents a nitrogen atom, an oxygen atom or a sulfur atom.

$Y_{41}$ to $Y_{48}$ each independently represent a nitrogen atom or a carbon atom bonded to another atom in the molecule of the third compound.

$X_4$ represents a nitrogen atom, an oxygen atom, a sulfur atom or a carbon atom.

$Y_{51}$ to $Y_{54}$ each independently represent a nitrogen atom or a carbon atom bonded to another atom in the molecule of the third compound.

In the exemplary embodiment, the third compound preferably contains the partial structure represented by the formula (323) among the formulae (321) to (326).

The partial structure represented by the formula (31) is preferably in the form of at least one group selected from the group consisting of groups represented by formulae (33) and (34) below and contained in the third compound.

For the third compound, bonding positions are preferably both situated in meta positions as shown in the formulae (33) and (34) to keep an energy gap $T_{77K}(M3)$ at 77 [K] high.

[Formula 24]

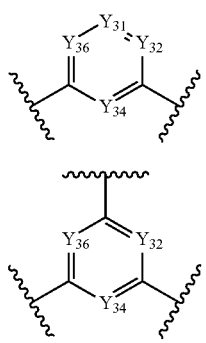

In the formulae (33) and (34), $Y_{31}$, $Y_{32}$, $Y_{34}$ and $Y_{36}$ each independently represent a nitrogen atom or $CR_{31}$, in which $R_{31}$ represents a hydrogen atom or a substituent. When $R_{31}$ is a substituent, the substituent is selected from the group consisting of a substituted or unsubstituted aromatic hydrocarbon group having 6 to 30 ring carbon atoms, a substituted or unsubstituted heterocyclic group having 5 to 30 ring atoms, a substituted or unsubstituted alkyl group having 1 to 30 carbon atoms, a substituted or unsubstituted fluoroalkyl group having 1 to 30 carbon atoms, a substituted or unsubstituted cycloalkyl group having 3 to 30 carbon atoms, a substituted or unsubstituted aralkyl group having 7 to 30 carbon atoms, a substituted silyl group, a substituted germanium group, a substituted phosphine oxide group, a halogen atom, a cyano group, a nitro group, and a carboxy group. However, the substituted or unsubstituted aromatic hydrocarbon group having 6 to 30 ring carbon atoms in $R_{31}$ is preferably a non-fused ring.

Wavy lines in the formulae (33) and (34) each show a bonding position with another atom or another structure in the molecule of the third compound.

In the formula (33), $Y_{31}$, $Y_{32}$, $Y_{33}$ and $Y_{36}$, are preferably each independently $CR_{31}$. A plurality of $R_{31}$ may be the same or different.

In the formula (34), $Y_{32}$, $Y_{34}$ and $Y_{36}$ are preferably each independently $CR_{31}$. A plurality of $R_{31}$ may be the same or different.

The substituted germanium group is preferably represented by —$Ge(R_{101})_3$. $R_{101}$ are each independently a substituent. The substituent $R_{101}$ is preferably a substituted or unsubstituted alkyl group having 1 to 30 carbon atoms or a substituted or unsubstituted aromatic hydrocarbon group having 6 to 30 ring carbon atoms. The plurality of $R_{101}$ may be mutually the same or different The partial structure represented by the formula (32) is preferably in the form of at least one group selected from the group consisting of groups respectively represented by formulae (35), (36), (37), (38), (39) and (30a) below and contained in the third compound.

[Formula 25]

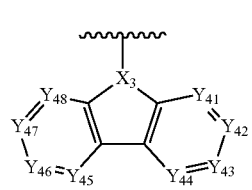

(35)

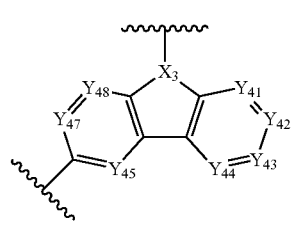

(36)

[Formula 26]

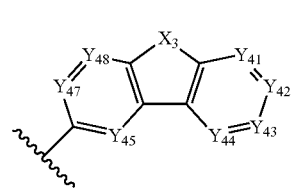

(37)

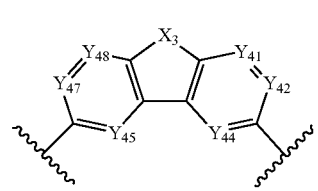

(38)

[Formula 27]

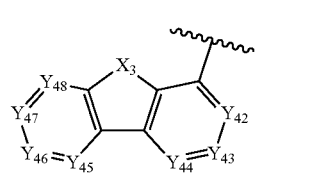

(39)

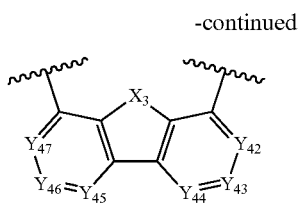
(30a)

In the formulae (35) to (39) and (30a), $Y_{41}$, $Y_{42}$, $Y_{43}$, $Y_{44}$, $Y_{45}$, $Y_{46}$, $Y_{47}$ and $Y_{48}$ each independently represent a nitrogen atom or $CR_{32}$.

$R_{32}$ represents a hydrogen atom or a substituent. When $R_{32}$ is a substituent, the substituent is selected from the group consisting of a substituted or unsubstituted aromatic hydrocarbon group having 6 to 30 ring carbon atoms, a substituted or unsubstituted heterocyclic group having 5 to 30 ring atoms, a substituted or unsubstituted alkyl group having 1 to 30 carbon atoms, a substituted or unsubstituted fluoroalkyl group having 1 to 30 carbon atoms, a substituted or unsubstituted cycloalkyl group having 3 to 30 carbon atoms, a substituted or unsubstituted aralkyl group having 7 to 30 carbon atoms, a substituted silyl group, a substituted germanium group, a substituted phosphine oxide group, a halogen atom, a cyano group, a nitro group, and a carboxy group. However, the substituted or unsubstituted aromatic hydrocarbon group having 6 to 30 ring carbon atoms in $R_{32}$ is preferably a non-fused ring.

$X_3$ in the formulae (35) and (36) represents a nitrogen atom.

$X_3$ in the formulae (37) to (39) and (30a) represents $NR_{33}$, an oxygen atom or a sulfur atom.

$R_{33}$ is a substituent selected from the group consisting of a substituted or unsubstituted aromatic hydrocarbon group having 6 to 30 ring carbon atoms, a substituted or unsubstituted heterocyclic group having 5 to 30 ring atoms, a substituted or unsubstituted alkyl group having 1 to 30 carbon atoms, a substituted or unsubstituted fluoroalkyl group having 1 to 30 carbon atoms, a substituted or unsubstituted cycloalkyl group having 3 to 30 carbon atoms, a substituted or unsubstituted aralkyl group having 7 to 30 carbon atoms, a substituted silyl group, a substituted germanium group, a substituted phosphine oxide group, a fluorine atom, a cyano group, a nitro group, and a carboxy group. However, the substituted or unsubstituted aromatic hydrocarbon group having 6 to 30 ring carbon atoms in $R_{33}$ is preferably a non-fused ring.

Wavy lines in the formulae (35) to (39) and (30a) each show a bonding position with another atom or another structure in the molecule of the third compound.

In the formula (35), $Y_{41}$ to $Y_{48}$ are preferably each independently $CR_{32}$. In the formulae (36) and (37), $Y_{41}$ to $Y_{45}$, $Y_{47}$ and $Y_{48}$ are preferably each independently $CR_{32}$. In the formula (38), $Y_{41}$, $Y_{42}$, $Y_{44}$, $Y_{45}$, $Y_{47}$ and $Y_{48}$ are preferably each independently $CR_{32}$. In the formula (39), $Y_{42}$ to $Y_{48}$ are preferably each independently $CR_{32}$. In the formula (30a), $Y_{42}$ to $Y_{47}$ are preferably each independently $CR_{32}$. A plurality of $R_{32}$ may be the same or different.

In the third compound, $X_3$ is preferably an oxygen atom or a sulfur atom, more preferably an oxygen atom.

In the third compound. $R_{31}$ and $R_{32}$ each independently represent a hydrogen atom or a substituent. The substituent in $R_{31}$ and $R_{32}$ is preferably selected from the group consisting of a fluorine atom, a cyano group, a substituted or unsubstituted alkyl group having 1 to 30 carbon atoms, a substituted or unsubstituted aromatic hydrocarbon group having 6 to 30 ring carbon atoms, and a substituted or unsubstituted heterocyclic group having 5 to 30 ring atoms. More preferably $R_{31}$ and $R_{32}$ are a hydrogen atom, a cyano group, a substituted or unsubstituted aromatic hydrocarbon group having 6 to 30 ring carbon atoms, or a substituted or unsubstituted heterocyclic group having 5 to 30 ring atoms. The substituted or unsubstituted aromatic hydrocarbon group having 6 to 30 ring carbon atoms in $R_{31}$ and $R_{32}$ is preferably a non-fused ring.

The third compound is also preferably an aromatic hydrocarbon compound or an aromatic heterocyclic compound. It is also preferable that the third compound has no fused aromatic hydrocarbon ring in a molecule.

Method of Preparing Third Compound

The third compound may be prepared by a method described in International Publications WO2012/153780, WO2013/038650 and the like.

Examples of the substituent in the third compound are shown below, but the invention is not limited thereto.

Specific examples of the aromatic hydrocarbon group (occasionally referred to as an aryl group) include a phenyl group, tolyl group, xylyl group, naphthyl group, phenanthryl group, pyrenyl group, chrysenyl group, benzo[c]phenanthryl group, benzo[g]chrysenyl group, benzoanthryl group, triphenylenyl group, fluorenyl group. 9,9-dimethylfluorenyl group, benzofluorenyl group, dibenzofluorenyl group, biphenyl group, terphenyl group, quarterphenyl group and fluoranthenyl group, among which a phenyl group, biphenyl group, terphenyl group, quarterphenyl group, naphthyl group, triphenylenyl group and fluorenyl group may be preferable.

Specific examples of the substituted aromatic hydrocarbon group include a tolyl group, xylyl group and 9,9-dimethylfluorenyl group.

As is understood from the specific examples, the aryl group includes both fused aryl group and non-fused aryl group.

Preferable examples of the aromatic hydrocarbon group include a phenyl group, biphenyl group, terphenyl group, quarterphenyl group, naphthyl group, triphenylenyl group and fluorenyl group.

Specific examples of the aromatic heterocyclic group (occasionally referred to as a heteroaryl group, heteroaromatic ring group or heterocyclic group) include a pyrrolyl group, pyrazolyl group, pyrazinyl group, pyrimidinyl group, pyridazynyl group, pyridyl group, triazinyl group, indolyl group, isoindolyl group, imidazolyl group, benzimidazolyl group, indazolyl group, imadazo[1,2-a]pyridinyl group, furyl group, benzofuranyl group, isobenzofuranyl group, dibenzofuranyl group, azadibenzofuranyl group, thiophenyl group, benzothiophenyl group, dibenzothiophenyl group, azadibenzothiophenyl group, quinolyl group, isoquinolyl group, quinoxalinyl group, quinazolinyl group, naphthyridinyl group, carbazolyl group, azacarbazolyl group, phenanthridinyl group, acridinyl group, phenanthrolinyl group, phenazinyl group, phenothiazinyl group, phenoxazinyl group, oxazolyl group, oxadiazolyl group, furazanyl group, benzoxazolyl group, thienyl group, thiazolyl group, thiadiazolyl group, benzothinzolyl group, triazolyl group and tetrazolyl group, among which a dibenzofuranyl group, dibenzothiophenyl group, carbazolyl group, pyridyl group, pyrimidinyl group, triazinyl group, azadibenzofuranyl group and azadibenzothiophenyl group may be preferable.

The aromatic heterocyclic group is preferably any one of a dibenzofuranyl group, dibenzothiophenyl group, carbazolyl group, pyridyl group, pyrimidinyl group, triazinyl group, azadibenzofuranyl group and azadibenzothiophenyl group, and further preferably any one of a dibenzofuranyl group, dibenzothiophenyl group, azadibenzofuranyl group and azadibenzothiophenyl group.

In the third compound, the substituted silyl group is also preferably a substituted or unsubstituted trialkylsilyl group, a substituted or unsubstituted arylalkylsilyl group, or a substituted or unsubstituted triarylsilyl group.

Specific examples of the substituted or unsubstituted trialkylsilyl group include a trimethylsilyl group and a triethysilyl group.

Specific examples of the substituted or unsubstituted arylalkylsilyl group include a diphenylmethylsilyl group, ditolylmethylsilyl group, and phenyldimethylsilyl group.

Specific examples of the substituted or unsubstituted triarylsilyl group include a triphenylsilyl group and a tritolylsilyl group.

In the third compound, the substituted phosphine oxide group is also preferably a substituted or unsubstituted diarylphosphine oxide group.

Specific examples of the substituted or unsubstituted diarylphosphine oxide group include a diphenylphosphine oxide group and ditolylphosphine oxide group.

The organic EL device in the exemplary embodiment is capable of prolonging a lifetime, improving a luminous efficiency, and inhibiting a roll-off when driven at a high current density.

The emitting layer of the organic EL device according to the second exemplary embodiment includes the delayed fluorescent first compound, the fluorescent second compound, and the third compound having a larger singlet energy than the first compound, whereby the luminous efficiency of the organic EL device is further improved. It is deduced that the luminous efficiency is improved because a carrier balance in the emitting layer is improved by containing the third compound.

Third Exemplary Embodiment

Arrangement(s) of an organic EL device according to a third exemplary embodiment will be described below. In the description of the third exemplary embodiment, the same components as those in the first exemplary embodiment are denoted by the same reference signs and names to simplify or omit an explanation of the components. In the third exemplary embodiment, the same materials and compounds as described in the first exemplary embodiment are usable for a material and a compound which are not particularly described.

In the third exemplary embodiment, the emitting layer of the organic EL device includes the first compound and the second compound, in which the first compound is a delayed fluorescent compound and the second compound is a fluorescent compound. An ionization potential Ip1 of the first compound and an ionization potential Ip2 of the second compound satisfy a relationship represented by a numerical formula (Numerical Formula 3). Ip1 and Ip2 preferably satisfy a numerical formula (Numerical Formula 3A).

$0 \leq Ip2 - Ip1 \leq 0.3$ eV  (Numerical Formula 3)

$0 < Ip2 - Ip1 \leq 0.3$ eV  (Numerical Formula 3A)

The first compound in the first exemplary embodiment is defined in terms of a predetermined emission quantum efficiency, whereas the first compound in the third exemplary embodiment is not defined in terms of the emission quantum efficiency as long as being a delayed fluorescent compound. Other components in the third exemplary embodiment are the same as those in the first exemplary embodiment.

In the organic EL device of the third exemplary embodiment, the emitting layer may further include the third compound described in the second exemplary embodiment.

When the numerical formula (Numerical Formula 3) is satisfied, the trap emission can be inhibited. When the trap emission is inhibited, a recombination of holes and electrons is promoted by the first compound that is the delayed fluorescent compound. Energy transfer quickly occurs from the first compound in the excited state to the second compound, whereby the first compound is returned to the ground state and the second compound is brought into the excited state. When the second compound in the excited state is returned to the ground state, light is irradiated. As described above, also in the exemplary embodiment, since the recombination of holes and electrons in the first compound is promoted, it is deduced that excitons for contributing to emission from the second compound are increased, resulting in an improvement in the luminous efficiency.

Further, since the trap emission by the second compound is inhibited, carriers (holes and electrons) are inhibited from colliding against excitons (singlet excitons and triplet excitons). As a result, it is deduced that, although the number of the carriers in the emitting layer is increased in the high current density region as compared with in the low current density region, a roll-off in the high current density region is also inhibited because the organic EL device of the exemplary embodiment can inhibit the carriers and the excitons from colliding to be deactivated.

Modification of Embodiments

It should be noted that the invention is not limited to the exemplary embodiment. The invention may include any modification and improvement compatible with the invention.

For instance, the emitting layer is not limited to a single layer, but may be provided by laminating a plurality of emitting layers. When the organic EL device has the plurality of emitting layers, it is only required that at least one of the emitting layers contains the first and second compounds. For instance, the rest of the emitting layers may be a fluorescent emitting layer or a phosphorescent emitting layer with use of emission caused by electron transfer from the triplet state directly to the ground state.

When the organic EL device includes the plurality of emitting layers, the plurality of emitting layers may be adjacent to each other, or provide a so-called tandem-type organic EL device in which a plurality of emitting units are layered through an intermediate layer.

For instance, a blocking layer may be provided in contact with an anode-side or a cathode-side of the emitting layer. The blocking layer is preferably provided in contact with the emitting layer to block at least ones of holes, electrons and excitons.

For instance, when the blocking layer is provided in contact with the cathode-side of the emitting layer, the blocking layer permits transport of elections, but prevents holes from reaching a layer provided near the cathode (e.g., the electron transporting layer) beyond the blocking layer. When the organic EL device includes the electron transporting layer, the blocking layer is preferably interposed between the emitting layer and the election transporting layer.

When the blocking layer is provided in contact with the anode-side of the emitting layer, the blocking layer permits transport of holes, but prevents electrons from reaching a layer provided near the anode (e.g., the hole transporting layer) beyond the blocking layer. When the organic EL device includes the hole transporting layer, the blocking layer is preferably interposed between the emitting layer and the hole transporting layer.

Further, the blocking layer may be provided in contact with the emitting layer to prevent an excitation energy from leaking from the emitting layer into a layer in the vicinity thereof. Excitons generated in the emitting layer are prevented from moving into a layer provided near the electrode (e.g., the electron transporting layer and the hole transporting layer) beyond the blocking layer.

The emitting layer and the blocking layer are preferably bonded to each other.

Further, the materials and treatments for practicing the invention may be altered to other arrangements and treatments as long as such other arrangements and treatments are compatible with the invention.

EXAMPLES

Examples of the invention will be described below. However, the invention is not limited to Examples.

Compounds used for preparing the organic EL device will be shown below.

[Formula 28]

HI

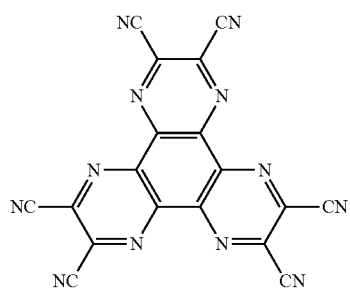

HT-1

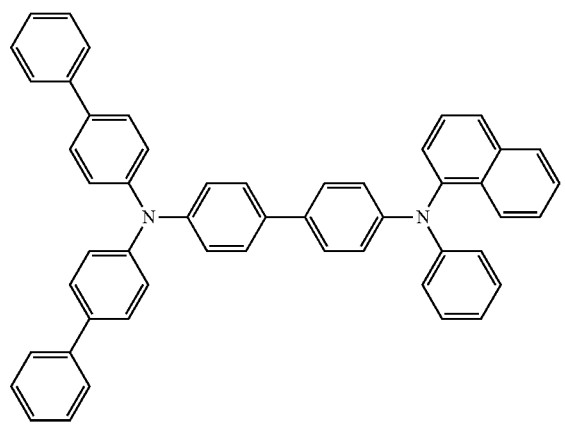

HT-2

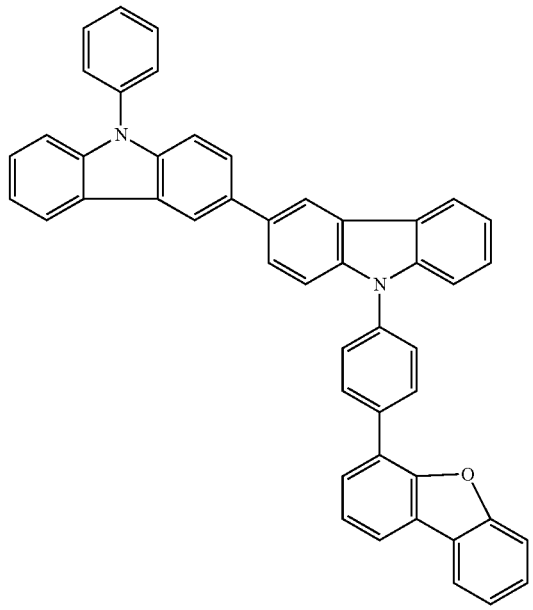

[Formula 29]

DA

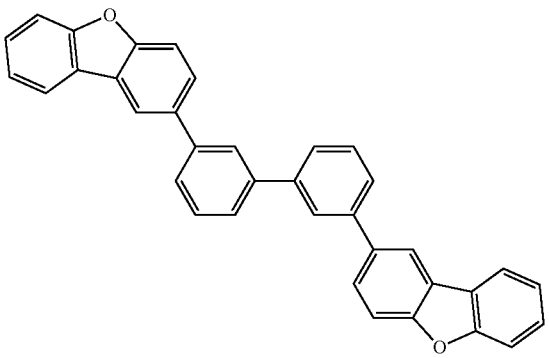

H-1

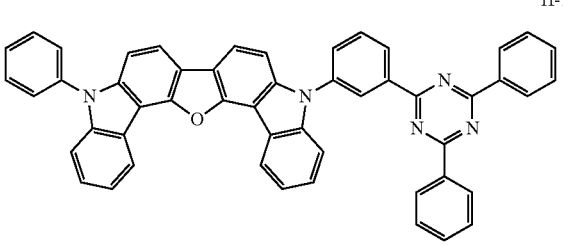

-continued

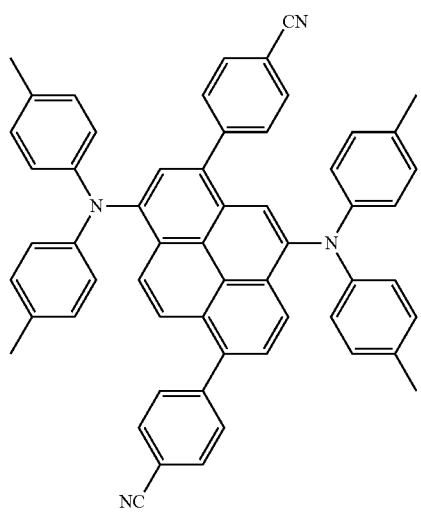
D-1

[Formula 30]

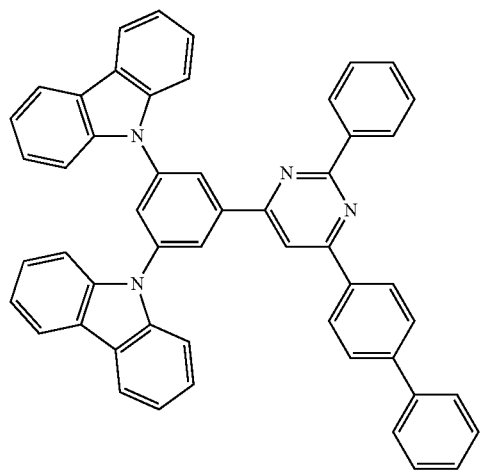
HB-1

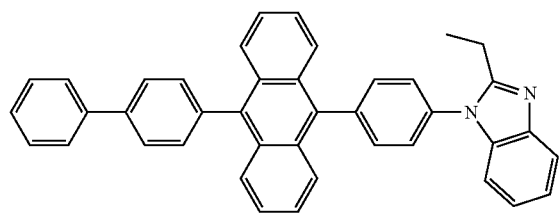
ET-1

[Formula 31]

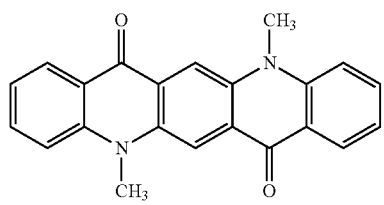
D-2

-continued

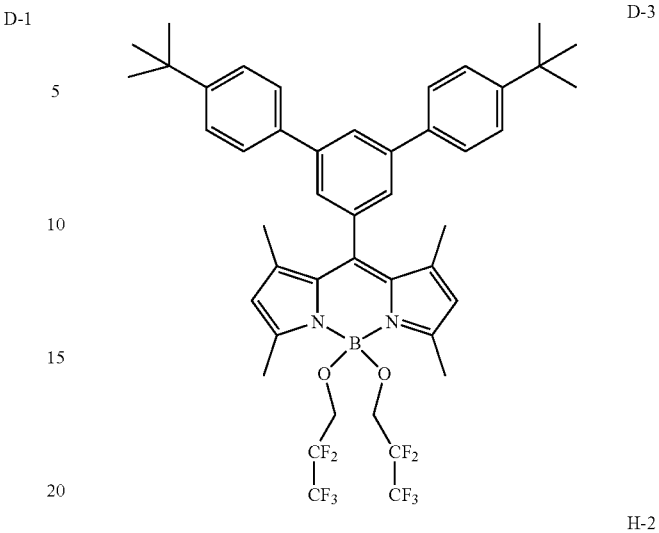

Evaluation of Compounds

Next, properties of the compounds used in Example were measured. A measurement method and a calculation method are shown below.

Measurement Method of Ionization Potential

A photoelectron spectroscopy device (AC-3, manufactured by Riken Keiki Co., Ltd.) was used for the measurement of an ionization potential under atmosphere. Specifically, a compound to be measured was irradiated with light and the amount of electrons generated by charge separation was measured.

Measurement Method of Emission Quantum Efficiency

An emission quantum efficiency Φ was measured as follows.

A sample (i.e., measurement target) was dissolved in a solvent of toluene to prepare a sample solution. The prepared sample solution was put into a 1-cm cell. An absorption spectrum of the cell was measured using an absorptiometer. An excitation wavelength in the luminescence spectrum measurement was determined based on the measured absorption spectrum. It should be noted that the excitation wavelength is desirably a wavelength providing an absorption peak, but not limited thereto. A concentration of the sample solution is desirably weak to inhibit the emission from being re-absorbed. In the present measurement, the concentration of the sample solution was prepared such that an absorbance in the excitation wavelength was 0.05 or less.

The sample solution as prepared above was put into a glass sample pipe provided with a vacuum stopcock. This sample pipe was connected to a vacuum line provided with a vacuum pump and a vacuum gauge and was subjected to freeze-deaeration. The freeze-deaeration in the present measurement refers to an operation in which a solution-accumulating portion of the sample pipe is soaked in liquid nitrogen to freeze the sample solution and an inside of the sample pipe is vacuumized. Moreover, in the present measurement, a rotary pump was used as the vacuum pump and a pirani vacuum gauge was used as the vacuum gauge. It should be noted that the vacuum pump and the vacuum gauge are not limited to the vacuum pump and the vacuum gauge used in the present measurement.

After the freeze-deaeration, the sample solution was dissolved at the room temperature and was again subjected to the freeze-deaeration. This operation was repeated until no change in the vacuum degree was observed. The solution obtained as a result of the repeated operation was defined as a deaeration sample solution.

The sample pipe containing the deaeration sample solution and a 1-cm lidded cell were put into a glove box. Under inactive gas (e.g., nitrogen) atmosphere in the glove box, the deaeration sample solution was transferred from the sample pipe to the lidded cell and the lidded cell was hermetically sealed. After hermetically sealed, the lidded cell was taken out of the glove box. A luminescence spectrum of the deaeration sample solution was measured using a fluorometer. A line connecting a rise of the obtained luminescence spectrum on a short-wave length side and a rise thereof on a long-wavelength side was defined as a reference line and an area intensity $F_1$ of the emission was calculated.

The above processes were also performed on a standard sample having a known emission quantum efficiency and an area intensity $F_2$ of the emission of the deaeration standard sample solution was calculated.

An emission quantum efficiency Φ of the target sample was obtained according to a formula A below.

$$\Phi = \Phi_2 \times \{(F_1 A_2 n_1^2)/(F_2 A_1 n_2^2)\}$$ (Formula A)

Herein, in the formula A, $\Phi_2$ represents an emission quantum efficiency of the standard sample. $A_1$ represents an absorbance of the sample solution in the excitation wavelength, $A_2$ represents an absorbance of the standard sample solution in the excitation wavelength, $n_1$ represents a refractive index of a solvent used for preparing the sample solution, and $n_2$ represents a refractive index of a solvent used for preparing the standard sample solution.

In Example, an ethanol solution of 9,10-diphenyl anthracene was used as the standard sample solution and $\Phi_2=0.95$ was determined (Morris et al., J. Phys. Chem., 80(1976) 969.).

Moreover, $n_1$ and $n_2$ were determined as $n_1=1.498$ (toluene) and $n_2=1.362$ (ethanol) ("Kagaku Binran (Handbook of Chemistry) Basic" the revised 5$^{th}$ edition, Chapter 14, II-640 page, issued on Feb. 1, 2004).

An absorptiometer (device name: UV-3100PC) manufactured by Shimadzu Corporation was used as an absorption spectrum measurement device. A fluorometer (device name: F-4500) manufactured by Hitachi, Ltd. was used as a luminescence spectrum measurement device.

The standard sample solution is not particularly limited to the solution used in the present measurement as long as having the known emission quantum efficiency. Moreover, the solvent is not limited to the solvent used in the present measurement. The absorption spectrum measuring device and the luminescence spectrum measurement device are not limited to the above devices used in the present measurement.

Measurement results of the ionization potential and the emission quantum efficiency are shown in Table 2. The emission quantum efficiency is expressed in a unit of percentage. It should be noted that Table 2 shows an emission quantum efficiency of a compound H-2 exceeding 99%.

TABLE 2

| Compound | Ionization Potential (eV) | Emission Quantum Efficiency (%) |
|---|---|---|
| H-1 | 5.60 | 63 |
| H-2 | 5.61 | 99< |
| D-1 | 5.64 | — |
| D-2 | 5.48 | — |
| D-3 | 6.45 | — |

Delayed Fluorescence Emission

Occurrence of delayed fluorescence emission was determined by measuring transient photoluminescence (PL) using a device shown in FIG. 2. A sample was prepared by co-depositing the compounds H-1 and TH-2 on a quartz, substrate at a ratio of the compound H-1 being 12 mass % to form a 100-nm-thick thin film. Emission from the compound H-1 include. Prompt emission observed immediately when the excited state is achieved by exciting the compound H-1 with a pulse beam (i.e., a beam emitted front a pulse laser) having an absorbable wavelength; and Delay emission observed not immediately when but after the excited state is achieved. Delayed fluorescence emission in the exemplary embodiment means that the amount of Delay emission is 5% or more relative to the amount of Prompt emission.

It has been confirmed that the amount of Delay emission of the compound H-1 is 5% or more relative to the amount of Prompt emission.

The amount of Prompt emission and the amount of Delay emission can be obtained in the same method as a method described in "Nature 492, 234-238, 2012." The amount of Prompt emission and the amount of Delay emission may be calculated using a device different from ones shown in FIG. 2 and described in Reference Literatures.

Singlet Energy S

The singlet energy S was measured as follows. 10 μmol/L of a toluene solution containing the target compound for the measurement was prepared and put in a quartz cell to prepare a sample. An absorption spectrum (ordinate axis; luminous intensity, abscissa axis; wavelength) of the sample was measured at a normal temperature (300 K). A tangent was drawn to the fall of the absorption spectrum on the long-wavelength side, and a wavelength value λedge [nm] at an intersection of the tangent and the abscissa axis was substituted in the following conversion equation to calculate a singlet energy.

$$S\ [eV] = 1239.85/\lambda\text{edge}$$ Conversion Equation 2:

In Example, the absorption spectrum was measured using a spectrophotometer manufactured by Hitachi, Ltd. (device name: U3310). It should be noted that the absorption spectrum measuring device may be different from the above device.

The calculated singlet energy S is shown below.
H-1: 2.74 eV
H-2: 2.89 eV
DA: 3.55 eV Preparation and Evaluation of Organic EL Device The organic EL devices were prepared in the following manner and evaluated.

Example 1

A glass substrate (size: 25 mm×75 mm×1.1 mm thick, manufactured by Geomatec Co., Ltd.) having an ITO transparent electrode (anode) was ultrasonic-cleaned in isopropyl alcohol for five minutes, and then UV/ozone-cleaned for 30 minutes. A film of ITO was 130 nm thick.

After the glass substrate having the transparent electrode line was cleaned, the glass substrate was mounted on a substrate holder of a vacuum evaporation apparatus. Initially, a compound HI was deposited on a surface of the glass substrate where the transparent electrode fine was provided in a manner to cover the transparent electrode, thereby forming a 5-nm-thick hole injecting layer.

Subsequently, a compound HT-1 was deposited on the hole injecting layer to form a 110-nm-thick first hole transporting layer on the HI film.

Next, a compound HT-2 was deposited on the first hole transporting layer to form a 15-nm-thick second hole transporting layer.

Next, a compound DA, the compound H-1 and a compound D-1 were co-deposited on the second hole transporting layer to form a 25-nm-thick emitting layer. In the emitting layer, a concentration of the compound H-1 was set to be 50 mass % and a concentration of the compound D-1 was set to be 1 mass %.

Next, a compound HB-1 was deposited on the emitting layer to form a 5-nm-thick hole blocking layer.

Next, a compound ET-1 was deposited on the hole blocking layer to form a 35-nm-thick electron transporting layer.

Lithium fluoride (LiF) was then deposited on the electron transporting layer to form a 1-nm-thick electron injecting electrode (cathode).

A metal aluminum (Al) was then deposited on the electron injecting electrode to form an 80-nm-thick metal Al cathode.

A device arrangement of the organic EL device in Example 1 is schematically shown as follows.

ITO(130)/HI(5)/HT-1(110)/HT-2(15)/DA:H-1:D-1(25, 50%, 1%)/HB-1(5)/ET-1(35)/LiF(1)/Al(80)

Numerals in parentheses represent a film thickness (unit: nm). The numerals in the form of percentage in parentheses indicate ratios (mass %) of the first and second compounds in the emitting layer.

Comparative 1

An organic EL device of Comparative 1 was manufactured in the same manner as the organic EL device of Example 1 except that a compound D-2 was used in place of the compound D-1 in the emitting layer of Example 1.

A device arrangement of the organic EL device of Comparative 1 is roughly shown as follows.

ITO(130)/HI(5)/HT-1(110)/HT-2(15)/DA:H-1:D-2(25, 50%, 1%)/HB-1(5)/ET-1(35)/LiF(1)/Al(80)

Comparative 2

An organic EL device of Comparative 2 was manufactured in the same manner as the organic EL device of Example 1 except that a compound D-3 was used in place of the compound D-1 in the emitting layer of Example 1.

A device arrangement of the organic EL device of Comparative 2 is roughly shown as follows.

ITO(130)/HI(5)/HT-1(110)/HT-2(15)/DA:H-1:D-3(25, 50%, 1%)/HB-1(5)/ET-1(35)/LiF(1)/Al(80)

Comparative 3

An organic EL device of Comparative 3 was manufactured in the same manner as the organic EL device of Example 1 except that the compound H-2 was used in place of the compound H-1 in the emitting layer of Example 1.

A device arrangement of the organic EL device of Comparative 3 is roughly shown as follows.

ITO(130)/HI(5)/HT-1(110)/HT-2(15)/DA:H-2:D-1(25, 50%, 1%)/HB-1(5)/ET-1(35)/LiF(1)/Al(80)

Comparative 4

An organic EL device of Comparative 4 was manufactured in the same manner as the organic EL device of Comparative 3 except that the compound D-2 was used in place of the compound D-1 in the emitting layer of Comparative 3.

A device arrangement of the organic EL device of Comparative 4 is roughly shown as follows.

ITO(130)/HI(5)/HT-1(110)/HT-2(15)/DA:H-2:D-2(25, 50%, 1%)/HB-1(5)/ET-1(35)/LiF(1)/Al(80)

Comparative 5

An organic EL device of Comparative 5 was manufactured in the same manner as the organic EL device of Comparative 3 except that the compound D-3 was used in place of the compound D-1 in the emitting layer of Comparative 3.

A device arrangement of the organic EL device of Comparative 5 is roughly shown as follows.

ITO(130)/HI(5)/HT-1(110)/HT-2(15)/DA:H-2:D-3(25, 50%, 1%)/HB-1(5)/ET-1(35)/LiF(1)/Al(80)

Evaluation of Organic EL Devices

The organic EL devices manufactured in Example 1 and Comparatives 1 to 5 were evaluated as follows. Evaluation results are shown in Tables 3 and 4.

CIE1931 Chromaticity

Voltage was applied on each of the manufactured organic EL devices such that the current density was 0.1 mA/cm$^2$, 1 mA/cm$^2$ or 10 mA/cm$^2$, where CIE1931 chromaticity coordinates (x, y) were measured using a spectroradiometer (manufactured by Konica Minolta. Inc., product name: CS-1000).

External Quantum Efficiency EQE

Voltage was applied on each of the organic EL devices such that the current density was 0.1 mA/cm$^2$, 1 mA/cm$^2$ or 10 mA/cm$^2$, where spectral radiance spectrum was measured using the above spectroradiometer. The external quantum efficiency EQE (unit: %) was calculated based on the obtained spectral-radiance spectrum, assuming that Lambertian radiation was performed.

Main Peak Wavelength $\lambda_P$

A main peak wavelength $\lambda_P$ was calculated based on the obtained spectral-radiance spectra.

Lifetime LT80

An initial current density was set at 50 mA/cm$^2$ and a continuous current test was performed. A time elapsed until a luminance intensity was reduced to 80% of an initial luminance intensity at the start of the test was defined as a lifetime (LT80).

Roll-Off

Each of the organic EL devices of Example 1 and Comparatives 1, 3 and 4 was driven under the driving conditions of the current densities at 0.1 mA/cm$^2$, 1 mA/cm$^2$ and 10 mA/cm$^2$. A ratio of the external quantum efficiency under each of the driving conditions relative to the highest external quantum efficiency among the obtained external quantum efficiencies was calculated.

TABLE 3

|  | Current Density (mA/cm$^2$) | Chromaticity x | Chromaticity y | EQE (%) | $\lambda_c$ (nm) | Roll-Off |
|---|---|---|---|---|---|---|
| Example 1 | 0.10 | 0.316 | 0.627 | 11.49 | 530 | 0.96 |
|  | 1.00 | 0.314 | 0.627 | 11.94 | 530 | 1.00 |
|  | 10 | 0.311 | 0.626 | 11.25 | 530 | 0.94 |
| Comparative 1 | 0.10 | 0.348 | 0.627 | 5.26 | 536 | 1.00 |
|  | 1.00 | 0.346 | 0.627 | 4.89 | 536 | 0.93 |
|  | 10 | 0.344 | 0.626 | 4.29 | 536 | 0.82 |
| Comparative 2 | 0.10 | 0.248 | 0.678 | 2.57 | 519 | — |
|  | 1.00 | 0.250 | 0.668 | 2.79 | 519 |  |
|  | 10 | 0.251 | 0.653 | 2.82 | 518 |  |
| Comparative 3 | 0.10 | 0.302 | 0.624 | 12.05 | 529 | 0.97 |
|  | 1.00 | 0.301 | 0.623 | 12.37 | 529 | 1.00 |
|  | 10 | 0.299 | 0.622 | 11.53 | 529 | 0.93 |
| Comparative 4 | 0.10 | 0.342 | 0.624 | 4.71 | 536 | 1.00 |
|  | 1.00 | 0.340 | 0.624 | 4.41 | 536 | 0.94 |
|  | 10 | 0.338 | 0.622 | 3.88 | 536 | 0.82 |
| Comparative 5 | 0.10 | 0.230 | 0.682 | 2.55 | 519 | — |
|  | 1.00 | 0.227 | 0.669 | 2.63 | 519 |  |
|  | 10 | 0.225 | 0.650 | 2.63 | 518 |  |

TABLE 4

|  | LT80 (hrs) |
|---|---|
| Example 1 | 40 |
| Comparative 1 | 25 |
| Comparative 2 | 5 |
| Comparative 3 | 27 |
| Comparative 4 | 22 |
| Comparative 5 | 4 |

As shown in Tables 3 and 4, as compared with the organic EL devices of Comparatives 1 to 5, the organic EL device of Example 1 exhibited a higher external quantum efficiency and a longer lifetime and inhibited roll-off when driven at a high current density.

The invention claimed is:

1. An organic electroluminescence device comprising:
an anode;
an emitting layer; and
a cathode,
wherein
the emitting layer comprises a first compound and a second compound,
the first compound is a delayed fluorescent compound,
the second compound is a fluorescent compound,
an emission quantum efficiency of the first compound is 70% or less, and
an ionization potential Ip1 of the first compound and an ionization potential Ip2 of the second compound satisfy a relationship of $0 \leq Ip2 - Ip1 \leq 0.8$ eV, wherein the emitting layer further comprises a third compound, and a singlet energy of the third compound is larger than a singlet energy of the first compound.

2. The organic electroluminescence device according to claim 1, wherein
the ionization potential Ip1 of the first compound and the ionization potential Ip2 of the second compound satisfy a relationship of $0 \leq Ip2 - Ip1 \leq 0.5$ eV.

3. The organic electroluminescence device according to claim 1, wherein the emission quantum efficiency of the first compound is 65% or less.

4. The organic electroluminescence device according to claim 1, wherein the emission quantum efficiency of the first compound is 60% or less.

5. The organic electroluminescence device according to claim 1, wherein the emission quantum efficiency of the first compound is 30% or more.

6. The organic electroluminescence device according to claim 1, wherein a singlet energy of the first compound is larger than a singlet energy of the second compound.

7. The organic electroluminescence device according to claim 1, wherein the second compound has an emission peak wavelength of 550 nm or less.

8. An organic electroluminescence device comprising:
an anode;
an emitting layer; and
a cathode,
wherein
the emitting layer comprises a first compound and a second compound,
the first compound is a delayed fluorescent compound,
the second compound is a fluorescent compound,
an ionization potential Ip1 of the first compound and an ionization potential Ip2 of the second compound satisfy a relationship of $0 \leq Ip2 - Ip1 \leq 0.3$ eV wherein the emitting layer further comprises a third compound, and a singlet energy of the third compound is larger than a singlet energy of the first compound.

9. The organic electroluminescence device according to claim 1, further comprising: a hole transporting layer between the anode and the emitting layer.

10. The organic electroluminescence device according to claim 1, further comprising: an electron transporting layer between the emitting layer and the cathode.

11. An electronic device comprising the organic electroluminescence device according to claim 1.

12. The organic electroluminescence device according to claim 8, further comprising: a hole transporting layer between the anode and the emitting layer.

13. The organic electroluminescence device according to claim 8, further comprising: an electron transporting layer between the emitting layer and the cathode.

14. An electronic device comprising the organic electroluminescence device according to claim 8.

15. The organic electroluminescence device according to claim 1, wherein the ionization potential Ip1 of the first compound and the ionization potential Ip2 of the second compound satisfy a relationship of $0 < Ip2 - Ip1 \leq 0.8$ eV.

16. The organic electroluminescence device according to claim 1, wherein the ionization potential Ip1 of the first compound and the ionization potential Ip2 of the second compound satisfy a relationship of $0 < Ip2 - Ip1 \leq 0.5$ eV.

17. The organic electroluminescence device according to claim 1, wherein the first compound is not a metal complex.

18. The organic electroluminescence device according to claim 1, wherein the emitting layer does not comprise a phosphorescent metal complex.

19. The organic electroluminescence device according to claim 1, wherein a content ratio of the first compound in the emitting layer is in a range from 40 mass % to 60 mass %.

20. The organic electroluminescence device according to claim 1, wherein the emission quantum efficiency of the first compound is 30% or more, the ionization potential Ip1 of the first compound and the ionization potential Ip2 of the second compound satisfy a relationship of $0 < Ip2 - Ip1 \leq 0.8$ eV, and the emitting layer does not comprise a phosphorescent metal complex.

21. The organic electroluminescence device according to claim 1, wherein the emission quantum efficiency of the first compound is 30% or more, a singlet energy of the first compound is larger than a singlet energy of the second compound, the second compound has an emission peak wavelength of 550 nm or less, the ionization potential Ip1 of the first compound and the ionization potential Ip2 of the second compound satisfy a relationship of $0 < Ip2 - Ip1 \leq 0.5$ eV, and the emitting layer does not comprise a phosphorescent metal complex.

\* \* \* \* \*